(12) United States Patent
Nishiwaki et al.

(10) Patent No.: US 10,651,276 B2
(45) Date of Patent: May 12, 2020

(54) SEMICONDUCTOR DEVICE

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventors: Tatsuya Nishiwaki, Nonoichi Ishikawa (JP); Kohei Oasa, Nonoichi Ishikawa (JP); Hiroshi Matsuba, Fujisawa Kanagawa (JP); Hung Hung, Kawasaki Kanagawa (JP); Kikuo Aida, Nomi Ishikawa (JP); Kentaro Ichinoseki, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/129,336

(22) Filed: Sep. 12, 2018

(65) Prior Publication Data

US 2019/0288071 A1    Sep. 19, 2019

(30) Foreign Application Priority Data

Mar. 15, 2018    (JP) ................. 2018-048141

(51) Int. Cl.
*H01L 29/66*    (2006.01)
*H01L 29/10*    (2006.01)
(Continued)

(52) U.S. Cl.
CPC ........ *H01L 29/1095* (2013.01); *H01L 29/407* (2013.01); *H01L 29/41725* (2013.01); *H01L 29/4236* (2013.01); *H01L 29/7813* (2013.01)

(58) Field of Classification Search
CPC ............. H01L 29/407; H01L 29/41725; H01L 29/4236; H01L 29/7813; H01L 29/1095
(Continued)

(56) References Cited

U.S. PATENT DOCUMENTS 9,087,893 B2 *   7/2015   Onishi ................. H01L 29/0634
9,496,339 B2 *   11/2016  Jin ....................... H01L 29/7827
(Continued)

FOREIGN PATENT DOCUMENTS

JP    2008-523586 A    7/2008
JP    2013-258333 A    12/2013
(Continued)

*Primary Examiner* — Tan N Tran
(74) *Attorney, Agent, or Firm* — Foley & Lardner LLP

(57) ABSTRACT

A semiconductor device has a cell which includes a first semiconductor region of a first conductive type, a base region of a second conductive type on the first semiconductor region, a source region of the first conductive type on the base region, a gate electrode penetrating through the base region in a first direction to reach the first semiconductor region and extending in a second direction, and a gate insulting film between the gate electrode and the first semiconductor region, between the gate electrode and the base region, and between the gate electrode and the source region. The cell has a region having a first threshold voltage and a region having a second threshold voltage higher than the first threshold voltage.

17 Claims, 44 Drawing Sheets

(51) Int. Cl.
*H01L 29/78* (2006.01)
*H01L 29/40* (2006.01)
*H01L 29/417* (2006.01)
*H01L 29/423* (2006.01)

(58) Field of Classification Search
USPC .......................................................... 257/330
See application file for complete search history.

(56) References Cited

U.S. PATENT DOCUMENTS

| | | | |
|---|---|---|---|
| 10,103,140 B2 * | 10/2018 | Pan | H01L 21/823487 |
| 2011/0204439 A1 * | 8/2011 | Kawaguchi | H01L 29/4236 |
| | | | 257/331 |
| 2013/0334597 A1 | 12/2013 | Yamashita | |
| 2015/0295495 A1 * | 10/2015 | Lui | H03K 17/164 |
| | | | 323/271 |
| 2016/0064550 A1 | 3/2016 | Sugimoto | |

FOREIGN PATENT DOCUMENTS

| | | |
|---|---|---|
| JP | 2016-054181 A | 4/2016 |
| WO | WO 2006/059300 A2 | 6/2006 |

* cited by examiner

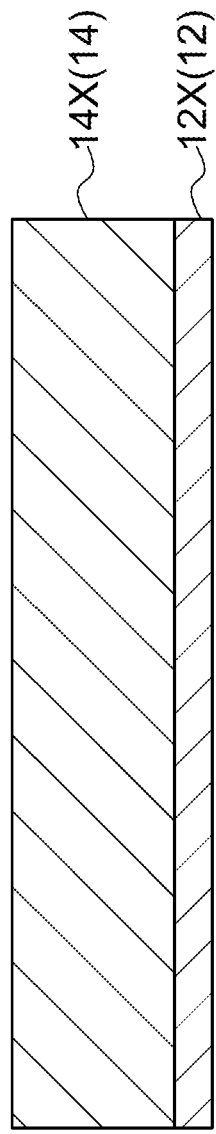
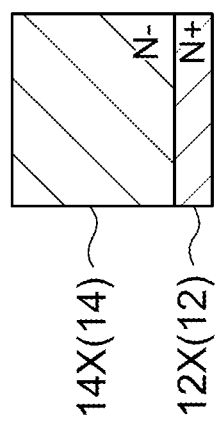

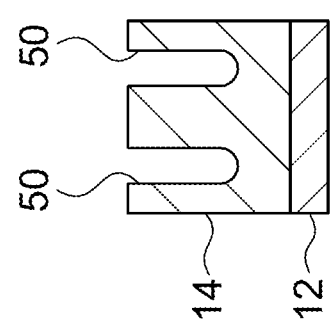
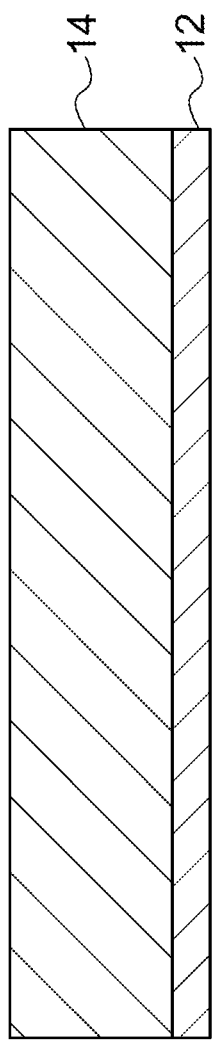

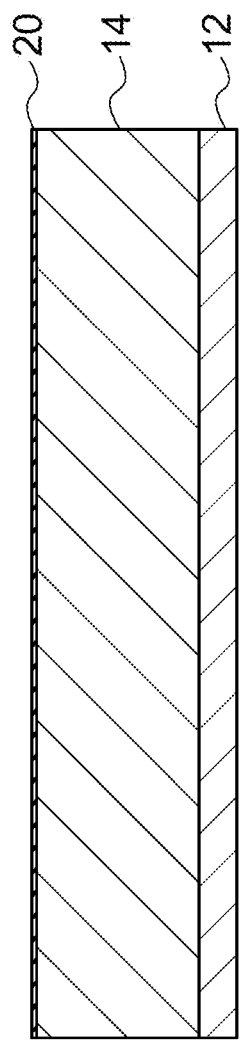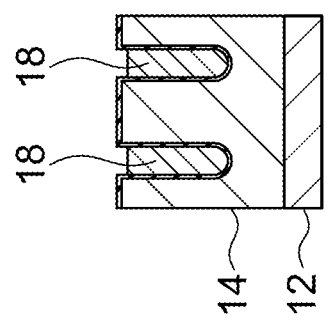

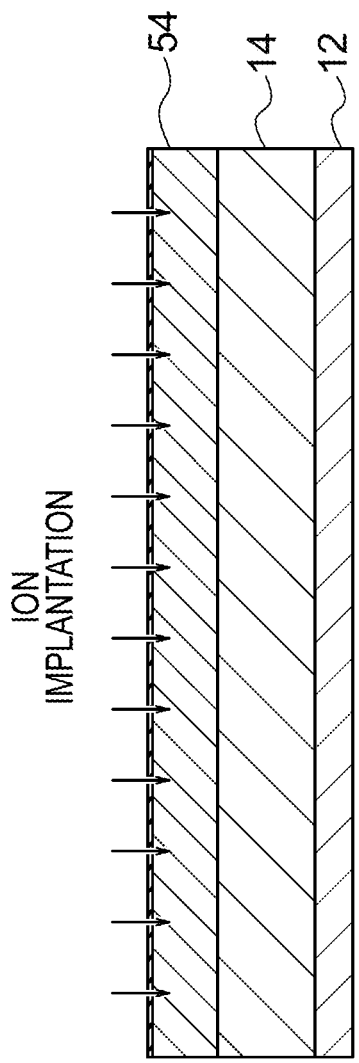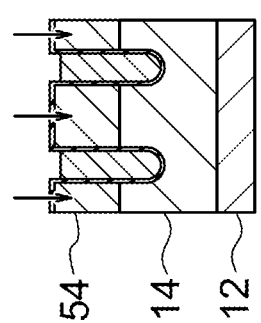

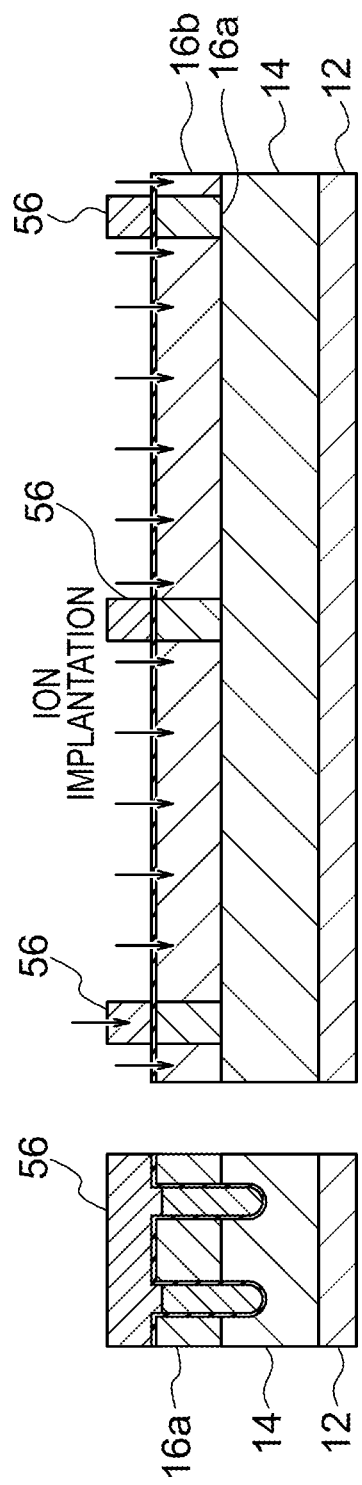

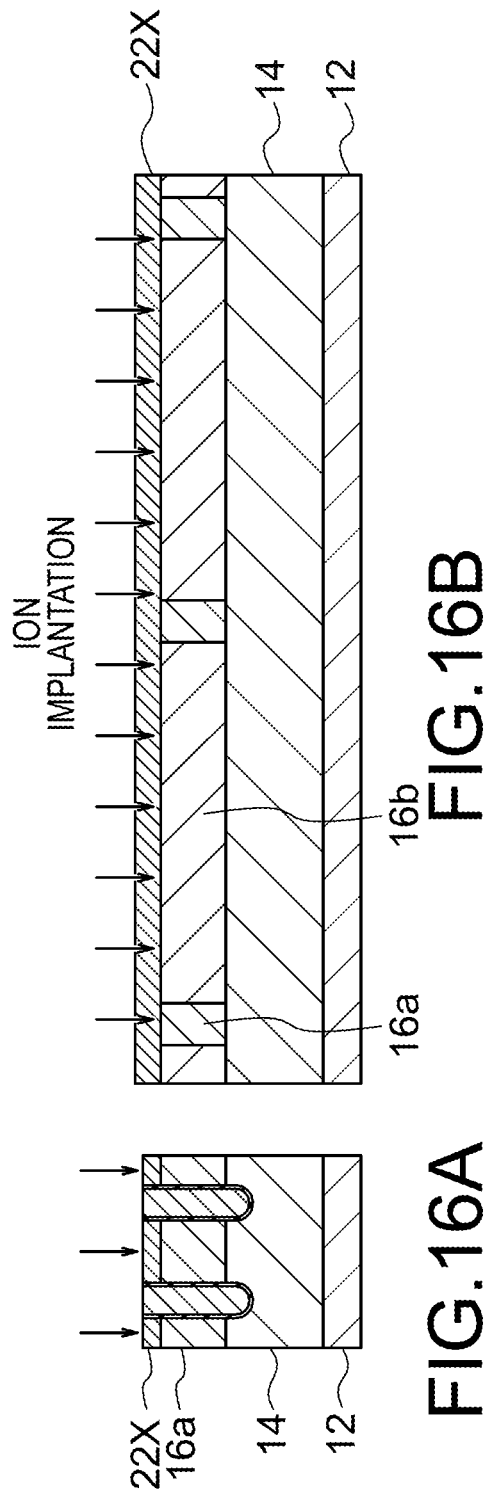

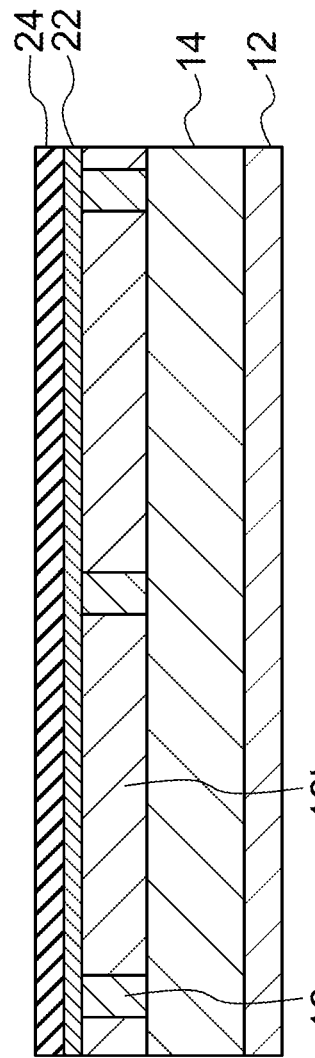

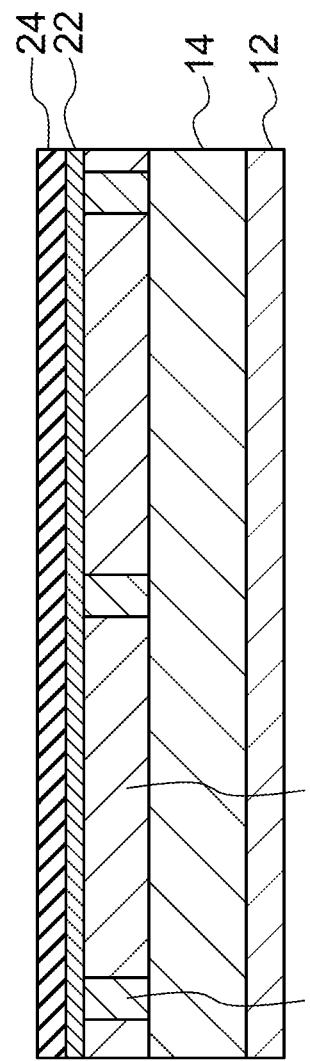
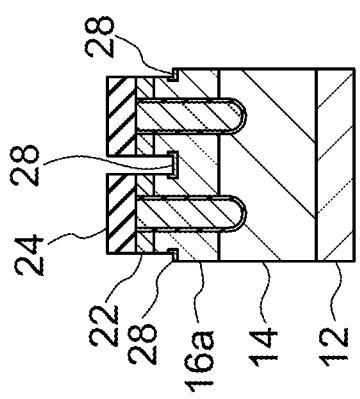

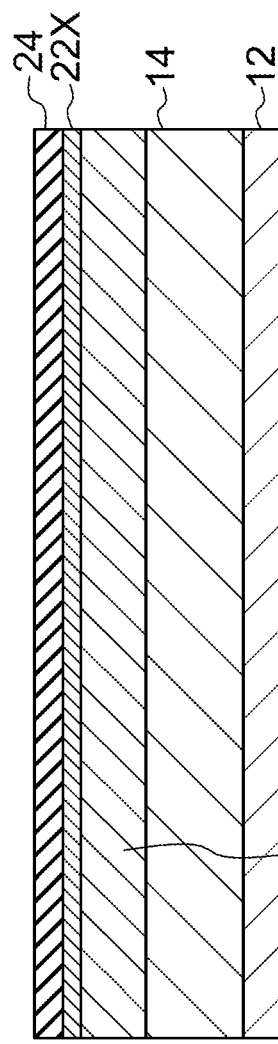
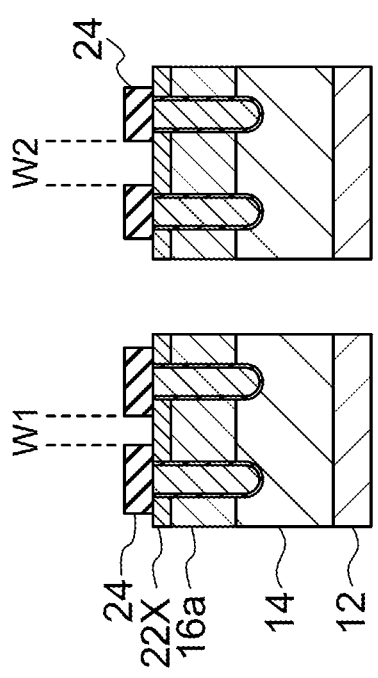
FIG.25A  FIG.25B  FIG.25C

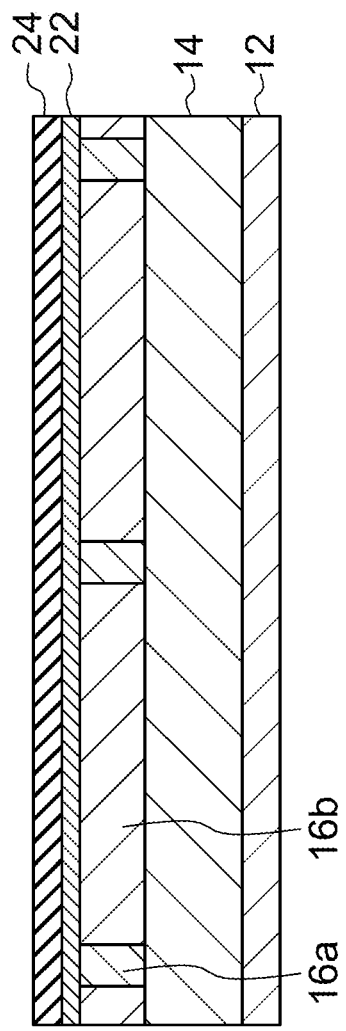
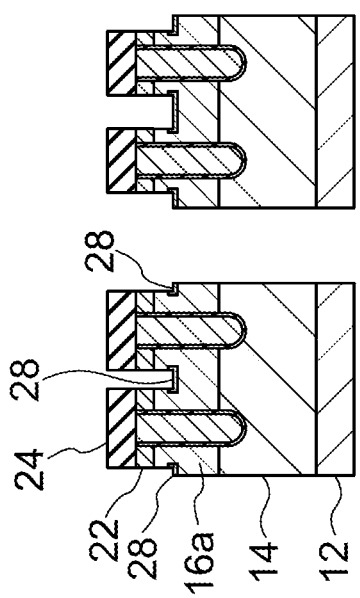
FIG.27A  FIG.27B  FIG.27C

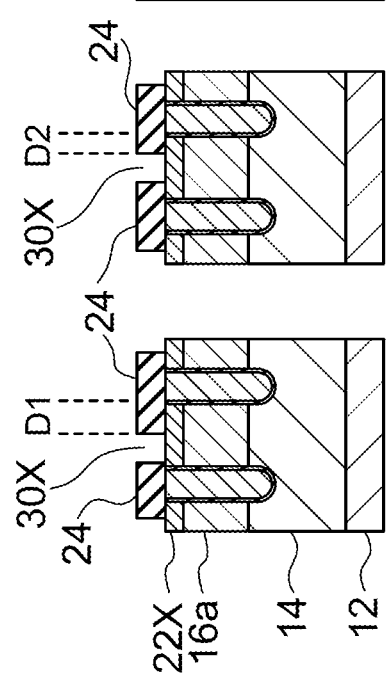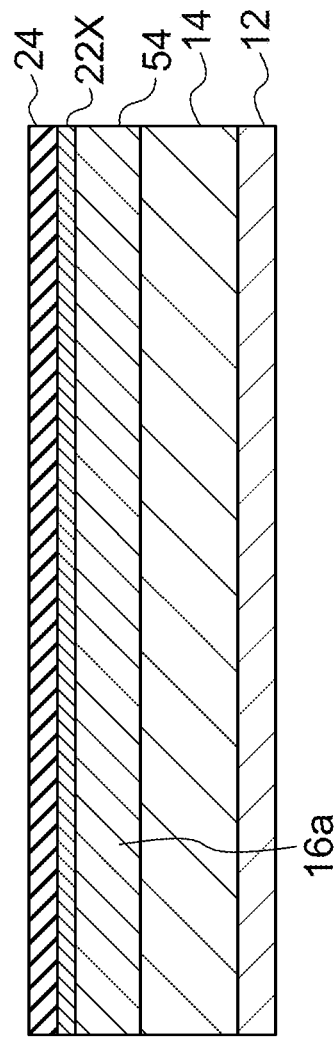

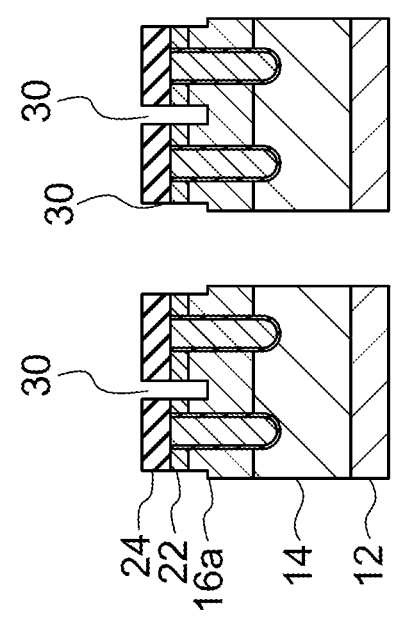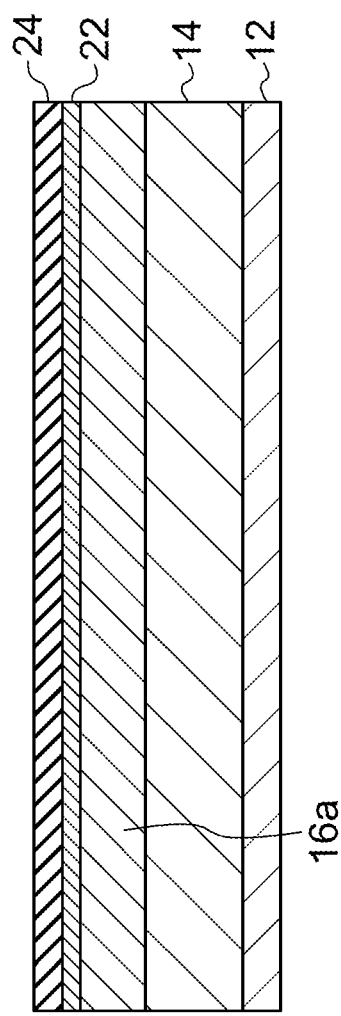

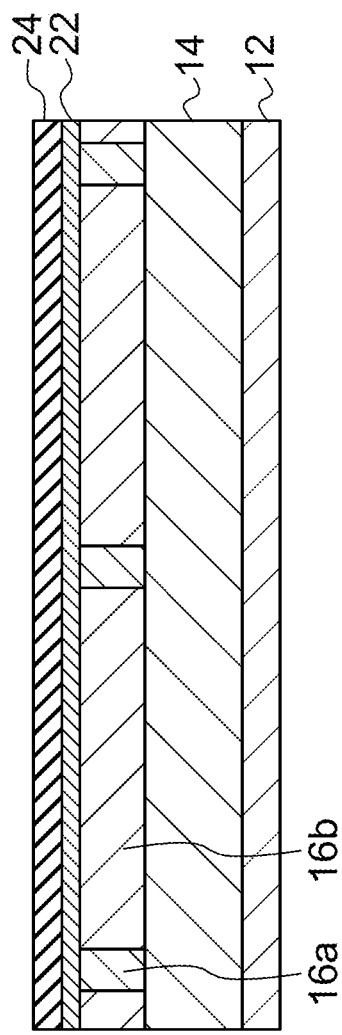
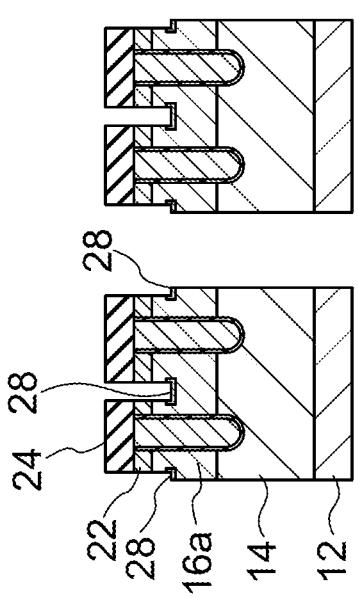
FIG.34A  FIG.34B
FIG.34C

SEMICONDUCTOR DEVICE

CROSS-REFERENCE TO RELATED APPLICATIONS

This application is based upon and claims the benefit of priority from Japanese Patent Application No. 2018-048141, filed on Mar. 15, 2018; the entire contents of which are incorporated herein by reference.

FIELD

Embodiments relate to a semiconductor device.

BACKGROUND

In recent years, power MOSFETs (Metal-oxide-semiconductor field-effect transistors) have increased channel density to reduce channel resistance, thereby reducing on-resistance. However, the increase in channel density due to the miniaturization tends to cause thermal runaway to narrow a safe operating area (SOA). For this reason, it is desired to improve the tradeoff between the widening of the safe operating area and the reduction of the on-resistance in semiconductor devices provided with MOSFETs and the like.

BRIEF DESCRIPTION OF THE DRAWINGS

FIGS. 9A and 9B are illustrations explaining part of a fabrication process of the semiconductor device according to the first embodiment;

FIGS. 10A and 10B are illustrations explaining part of the fabrication process of the semiconductor device according to the first embodiment;

FIGS. 13A and 13B are illustrations explaining part of the fabrication process of the semiconductor device according to the first embodiment;

FIGS. 14A and 14B are illustrations explaining part of the fabrication process of the semiconductor device according to the first embodiment;

FIGS. 15A and 15B are illustrations explaining part of the fabrication process of the semiconductor device according to the first embodiment;

FIGS. 16A and 16B are illustrations explaining part of the fabrication process of the semiconductor device according to the first embodiment;

FIGS. 19A and 19B are illustrations explaining part of the fabrication process of the semiconductor device according to the first embodiment;

FIGS. 20A and 20B are illustrations explaining part of the fabrication process of the semiconductor device according to the first embodiment;

FIGS. 25A, 25B and 25C are illustrations explaining part of a fabrication process of the semiconductor device according to the second embodiment;

FIGS. 27A, 27B and 27C are illustrations explaining part of the fabrication process of the semiconductor device according to the second embodiment;

FIGS. 32A, 32B and 32C are illustrations explaining part of a fabrication process of the semiconductor device according to the third embodiment;

FIGS. 33A, 33B and 33C are illustrations explaining part of the fabrication process of the semiconductor device according to the third embodiment;

FIGS. 34A, 34B and 34C are illustrations explaining part of the fabrication process of the semiconductor device according to the third embodiment;

DETAILED DESCRIPTION

Hereinbelow, a semiconductor device according to the present embodiment will be explained with reference to the drawings. In the following explanation, the same reference signs are given to elements having a roughly equivalent function and configuration, for which duplicate explanation will be given only if necessary.

In the explanation of each of the following embodiments, an n-type and a p-type correspond to a first conductive type and a second conductive type, respectively. The notations of $n^+$ and $p^+$ indicate high impurity relative to the notation without $^+$ whereas the notations of $n^-$ and $p^-$ indicate low impurity relative to the notation without $^-$. Moreover, for example, the notation of $p^{++}$ indicates further high impurity relative to the notation of $p^+$.

First Embodiment

A semiconductor device according to a first embodiment has a plurality of cells and has an arrangement of a region of a high threshold voltage and a region of a low threshold voltage formed dispersedly in one cell. Having this arrangement, the semiconductor device according to the first embodiment aims to, at a low gate voltage, restrict transconductance (Gm) to be low to avoid narrowing of the safe operating area by turning on the region of the low threshold voltage and, at a high gate voltage, to reduce on-resistance by turning on also the region of the high threshold voltage. The details will be explained below.

Figure 1:
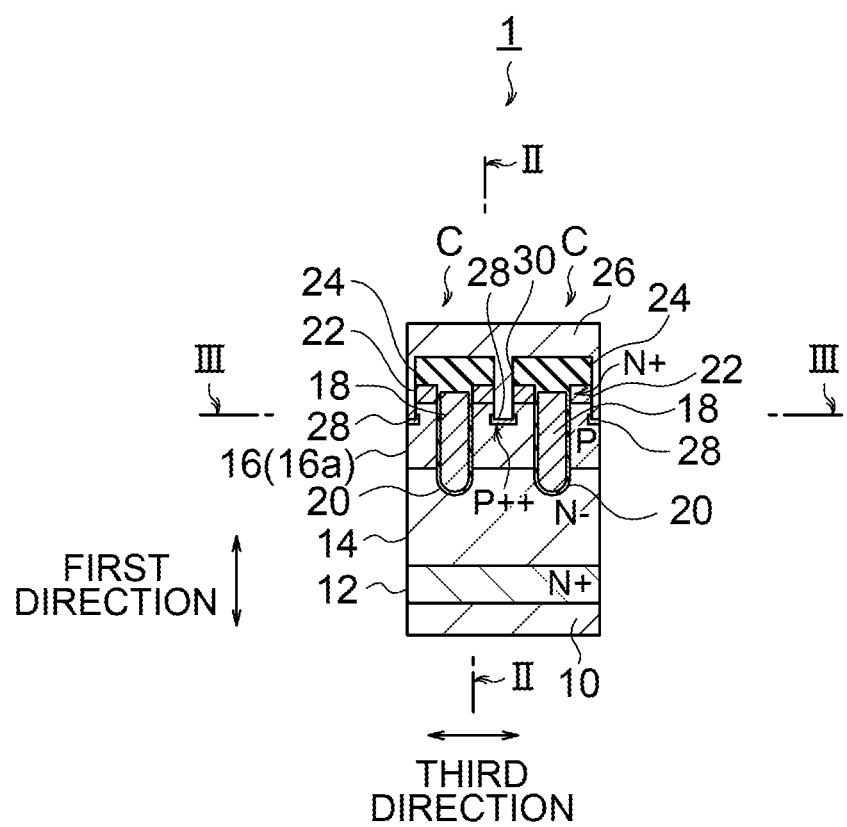
FIG. 1 is a sectional view taken on line I-I in FIG. 2 of a semiconductor device according to a first embodiment.
Figure 2:
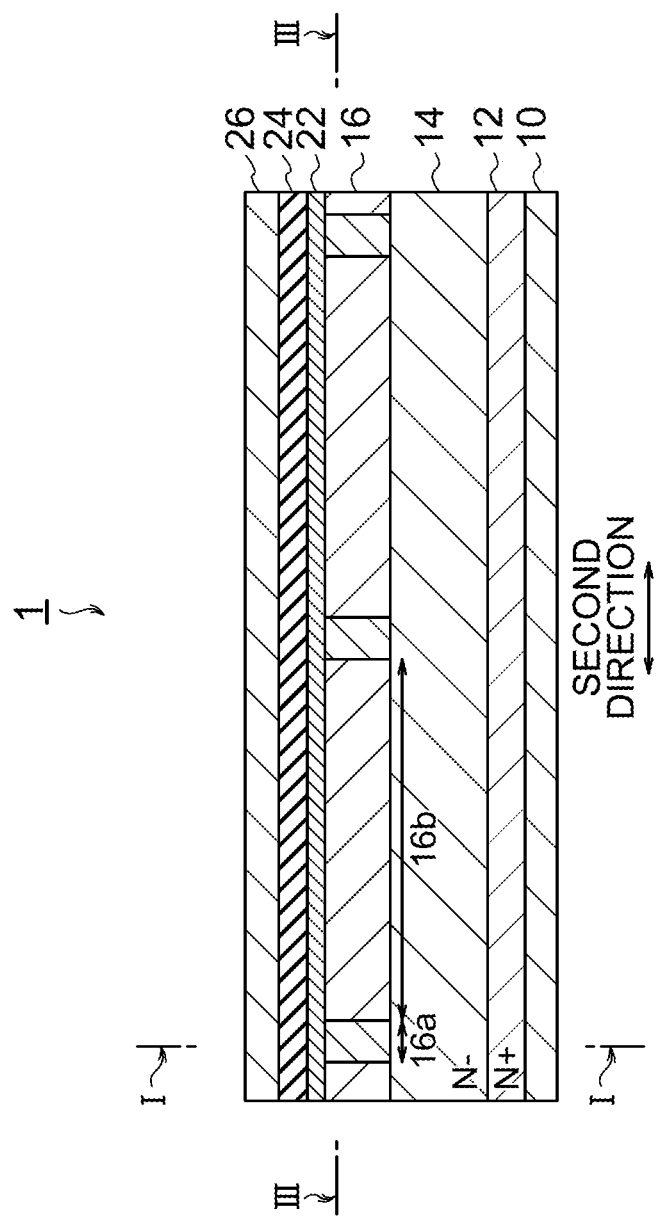
FIG. 2 is a sectional view taken on line II-II in FIG. 1 of the semiconductor device according to the first embodiment.
Figure 3:
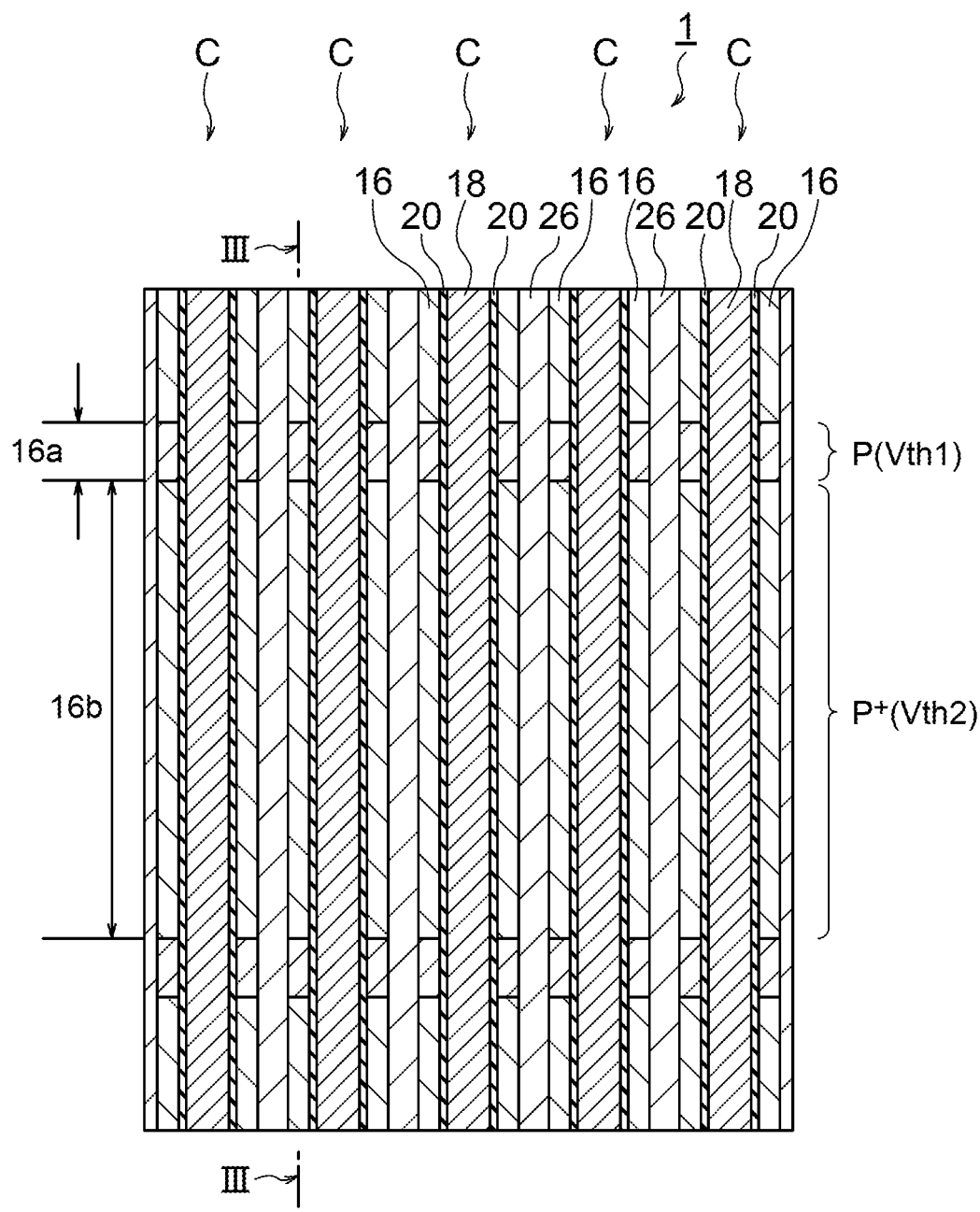
FIG. 3 is a sectional view taken on line III-III in FIG. 1 of the semiconductor device according to the first embodiment.

FIG. 1 is a sectional view taken on line I-I in FIG. 2 of a semiconductor device 1 according to the present embodiment. FIG. 2 is a sectional view taken on line II-II in FIG. 1 of the semiconductor device 1 according to the present embodiment. FIG. 3 is a sectional view taken on line III-III in FIG. 1 of the semiconductor device 1 according to the present embodiment. In other words, FIG. 1 is a sectional view of the semiconductor device 1 in an orthogonal-to-trench direction, FIG. 2 is a sectional view of the semiconductor device 1 in a trench longitudinal direction parallel to trenches, and FIG. 3 is a sectional view of the semiconductor device 1 in a front surface direction.

As understood from FIGS. 1 to 3, the semiconductor device 1 according to the present embodiment is configured provided with a plurality of cells C. Although FIGS. 1 and 3 show two and five cells C, respectively, as an example, the semiconductor device 1 can be provided with any number of cells C.

The semiconductor device 1 according to the present embodiment is configured provided with a drain electrode 10, an $n^+$-type drain region 12, an $n^-$-type drift region 14, a p-type base region 16, gate electrodes 18, gate insulating films 20, $n^+$-type source regions 22, insulating regions 24, a source electrode 26, and $p^{++}$-type contact regions 28. That is, in the present embodiment, the semiconductor device 1 is configured provided with a trench-gate MOSFET. In other words, in the present embodiment, one cell C includes two MOSFET channels which are formed on both sides of one of the gate electrodes 18. Incidentally, in a termination region of the cells C, one cell C may include one MOSFET channel which is formed on one side of one of the gate electrodes 18.

In more specifically, formed on the drain electrode 10 is the drain region 12 on which the drift region 14 is formed, and on the drift region 14, the base region 16 is formed. The drain electrode 10, the drain region 12, the drift region 14, and the base region 16 are formed so as to be shared by the plurality of cells C.

On the base region 16, a source region 22 is formed for each cell C. Moreover, for each cell C, a gate electrode 18 is formed to penetrate through the source region 22 and the base region 16 to reach the drift region 14. The gate electrode 18 extends in a trench longitudinal direction. Formed around each gate electrode 18 is a gate insulating film 20 to keep insulation of the gate electrode 18 against its surrounding. In detail, the gate insulating film 20 is formed between the gate electrode 18 and the drift region 14, and between the gate electrode 18 and the base region 16.

Formed on the source region 22 and the gate insulating film 20 is an insulating region 24 on which the source electrode 26 is formed. In the present embodiment, a trench 30 that penetrates through the insulating region 24 and the source electrode 26 to reach the base region 16 is formed between the gate electrodes 18. The source electrode 26 is formed to fill the trench 30. The source electrode 26 is formed to have a trench contact structure for miniaturization of the gate structure to keep a high avalanche breakdown voltage while reducing on-resistance.

A contact region 28 is formed in the base region 16 that is situated in the bottom of the trench 30. The contact region 28 is formed to have higher impurity concentration than the base region 16 to reduce connection resistance between the source electrode 26 and the base region 16. For this reason, the contact region 28 can be omitted theoretically.

As understood from especially FIGS. 2 and 3, when the base region 16 is viewed in cross section in the trench longitudinal direction, the base region 16 is formed with a first base region 16a of low impurity concentration and a second base region 16b of higher impurity concentration than the first base region 16a. Therefore, when the threshold voltages of the first and second base regions 16a and 16b are denoted as Vth1 and Vth2, respectively, the threshold voltage Vth2 is higher than the threshold voltage Vth1, so that a relationship Vth1<Vth2 holds. In other words, regions of different threshold voltages are formed in one cell C. Therefore, when a voltage is applied to the gate electrode 18 while a positive voltage is being applied to the drain region 12 with respect to the source electrode 26, a MOSFET channel in the first base region 16a turns into an on-state at a low voltage of Vth1, whereas a MOSFET channel in the second base region 16b remains in an off-state. Then, when the voltage applied to the gate electrode 18 becomes higher than Vth2, the MOSFET channel in the second base region 16b also turns into the on-state. As described above, in the present embodiment, a region of the threshold voltage Vth1 and a region of the threshold voltage Vth2 higher than the threshold voltage Vth1 are formed in one cell.

In the present embodiment, the first and second base regions 16a and 16b are cyclically arranged in the base regions 16 in the trench longitudinal direction. Since the first and second base regions 16a and 16b are formed for each cell C, in other words, in the entire semiconductor device 1, the first and second base regions 16a and 16b are dispersedly formed. For example, in the present embodiment, in FIG. 3, the first base regions 16a are dispersedly formed so as to have an area ratio of 1:2 between the first and second base regions 16a and 16b, or so as to have a percentage lower than the area ratio of 1:2. Accordingly, it can be stated that an area of the first base regions 16a are smaller than an area of the second base regions 16b. In other words, it can be stated that the area of the first base regions 16a are one-half or smaller of the area of the second base regions 16b.

Moreover, it is a precondition in the present embodiment that, for example, the threshold voltage Vth1 ranges from 1 to 3 volts and the threshold voltage Vth2 ranges from 4 to 6 volts. In order to have these threshold voltage ranges, the dose amount in ion implantation to the first base regions 16a is in the range from about $1 \times 10^{13}$ cm$^{-2}$ to $3 \times 10^{13}$ cm$^{-2}$ and the dose amount in ion implantation to the second base regions 16b is in the range from about $4 \times 10^{13}$ cm$^{-2}$ to $7 \times 10^{13}$ cm$^{-2}$. In order to achieve these dose amounts, the film thickness of the gate insulating film 20 is 50 nm, although the required dose amounts vary depending on base diffusion conditions.

Figure 4:
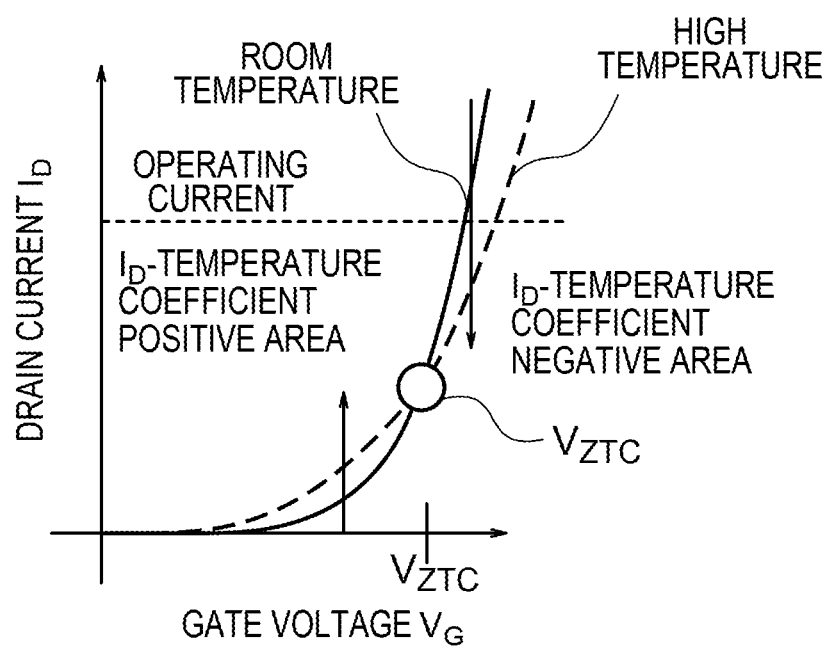
FIG. 4 is a graph representing a relationship between a gate voltage $V_G$ and a drain current $I_D$ when the gate voltage $V_G$ is varied in a state where a predetermined positive voltage is being applied to a drain region with respect to a source electrode.

Subsequently, the operation principle of the semiconductor device 1 according to the present embodiment will be explained. FIG. 4 is a graph representing a relationship between a gate voltage $V_G$ and a drain current $I_D$ when the gate voltage $V_G$ is varied in a state where a predetermined positive voltage is being applied to the drain region 12 with respect to the source electrode 26. Moreover, in FIG. 4, the solid line graph represents the change in drain current $I_D$ at a room temperature and the dot line graph represents the change in drain current $I_D$ at a temperature higher than the room temperature. As understood from these graphs of FIG. 4, the change in drain current $I_D$ at the room temperature and the change in drain current $I_D$ at a higher temperature are different from each other, and both graphs cross each other at a zero-temperature coefficient voltage $V_{ZTC}$ which is a specific gate voltage. The drain current $I_D$ has a positive temperature coefficient to the temperature change at a gate voltage lower than the zero-temperature coefficient voltage $V_{ZTC}$, whereas, has a negative temperature coefficient to the temperature change at a gate voltage higher than the zero-temperature coefficient voltage $V_{ZTC}$. For this reason, in an area of a positive temperature coefficient to the temperature change, in which the gate voltage $V_G$ is lower than the zero-temperature coefficient voltage $V_{ZTC}$, a positive feedback occurs in such a manner as follows. The drain current $I_D$ increases as the temperature increases and hence the temperature increases further, which may cause thermal runaway. For this reason, the safe operating area is restricted.

Figure 5:
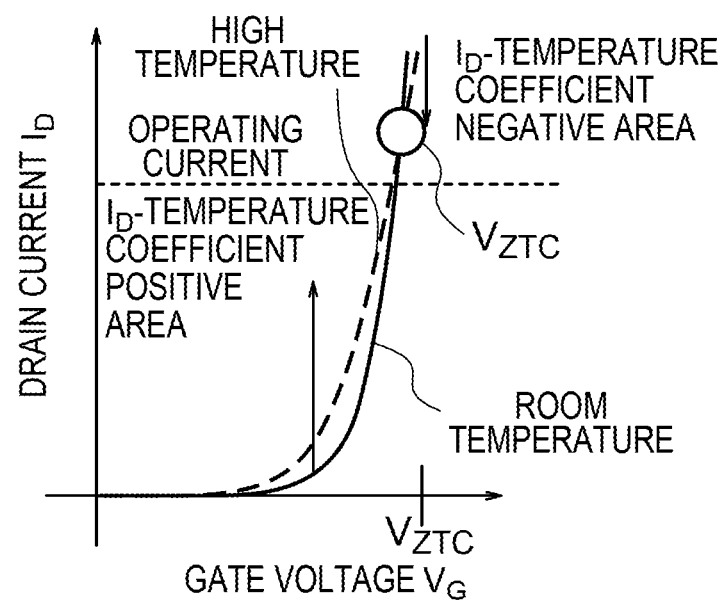
FIG. 5 is a graph representing a relationship between a gate voltage $V_G$ and a drain current $I_D$ in the case of a miniaturized semiconductor device that shows the characteristics of FIG. 4.

FIG. 5 is a graph representing a relationship between the gate voltage $V_G$ and the drain current $I_D$ in the case of a miniaturized semiconductor device that shows the characteristics of FIG. 4. As understood from FIG. 5, the zero-temperature coefficient voltage $V_{ZTC}$ becomes higher compared to FIG. 4, as the miniaturization of the semiconductor device proceeds. As the zero-temperature coefficient voltage $V_{ZTC}$ becomes higher, thermal runaway tends to occur due to decrease in the area of a negative temperature coefficient to the temperature change, in which the gate voltage $V_G$ is higher than the zero-temperature coefficient voltage $V_{ZTC}$. In detail, the level of an operating current, that is, the drain current $I_D$, becomes lower than the cross point with the zero-temperature coefficient voltage $V_{ZTC}$, so that the semiconductor device operates in the area of a positive temperature coefficient to the temperature change, in which the gate voltage $V_G$ is lower than the zero-temperature coefficient voltage $V_{ZTC}$. For this reason, thermal runaway tends to occur to narrow the safe operating area.

Figure 6:
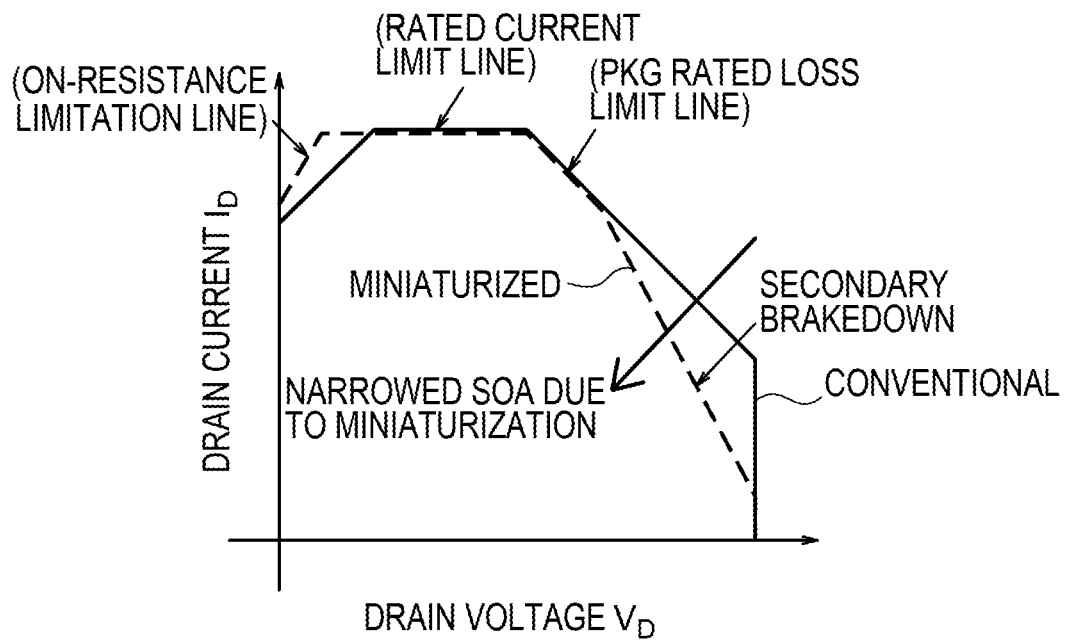
FIG. 6 is a graph representing a relationship between a drain voltage $V_D$ and a drain current $I_D$.

FIG. 6 is a graph representing a relationship between the drain voltage $V_D$ and the drain current $I_D$, in which the solid line graph and the dot line graph indicate the relationship in a conventional semiconductor device and the miniaturized semiconductor device, respectively. The inside area of the graphs represents the safe operating area in each of the conventional and miniaturized semiconductor devices. It is understood from FIG. 6, because of the miniaturization of the semiconductor device, the drain current $I_D$ to be allowed to flow decreases to narrow the safe operating area in an area of high drain voltage $V_D$.

Figure 7:
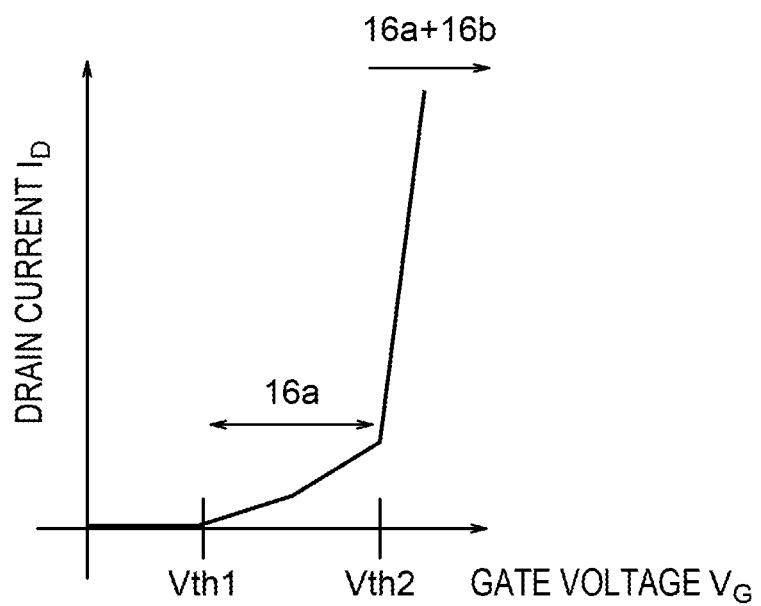
FIG. 7 is a graph representing a relationship between a gate voltage $V_G$ and a drain current $I_D$ when the gate voltage $V_G$ is varied in a state where a predetermined positive voltage is being applied to a drain region with respect to a source electrode.

FIG. 7 shows a graph corresponding to the above-described FIG. 4, in the semiconductor device 1 according to the present embodiment. In detail, FIG. 7 shows a graph representing a relationship between the gate voltage $V_G$ and the drain current $I_D$ when the gate voltage $V_G$ is varied in a state where a predetermined positive voltage is being applied to the drain region 12 with respect to the source electrode 26. In the graph of FIG. 7, the MOSFET channels in both of the first and second base regions 16a and 16b are in the off-state when the gate voltage $V_G$ is lower than the threshold voltage Vth1.

When the gate voltage $V_G$ becomes higher than the threshold voltage Vth1, the MOSFET channel in the first base region 16a turns into the on-state whereas the MOSFET channel in the second base region 16b remains in the off-state. Since the MOSFET channel in the first base region 16a only turns into the on-state, the increase in drain current $I_D$ is not so much even if the gate voltage $V_G$ becomes higher. In other words, sine part of the MOSFET channels only turns into the on-state, it is achieved to make moderate the rise-up of the drain current $I_D$.

When the gate voltage $V_G$ becomes higher than the threshold voltage Vth2, not only the MOSFET channel in the first base region 16a, but also the MOSFET channel in the second base region 16b turns into the on-state, which causes abrupt increase in drain current $I_D$. It can be said that the semiconductor device 1, in the case where the gate voltage $V_G$ is higher than the threshold voltage Vth2, has the same characteristics as the conventional semiconductor device.

Figure 8:
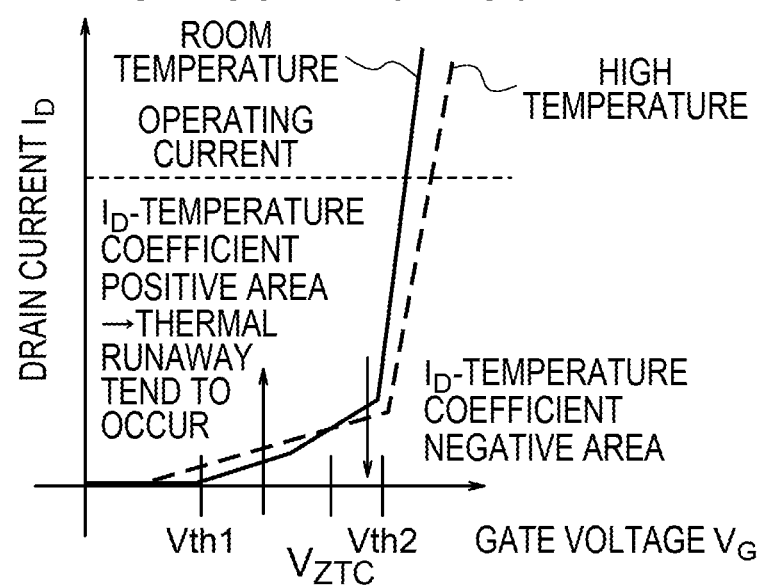
FIG. 8 is a graph made by overlapping the graph of FIG. 7 and a graph that represents a relationship between the gate voltage $V_G$ and the drain current $I_D$ when the gate voltage $V_G$ is varied at a temperature higher than a room temperature.

FIG. 8 is a graph made by overlapping the graph of FIG. 7 and a graph that represents a relationship between the gate voltage $V_G$ and the drain current $I_D$ when the gate voltage $V_G$ is varied at a temperature higher than the room temperature. The cross point of the zero-temperature coefficient voltage $V_{ZTC}$ is located in an area of a small drain current $I_D$, and hence an area of a positive temperature coefficient is restricted to be smaller. In an area of the gate voltage $V_G$ higher than the threshold voltage Vth2, the MOSFET channels in the first and second base regions 16a and 16b both turn into the on-state, and hence it is achieved to lower the on-resistance of the semiconductor device 1 having the characteristics shown in FIG. 8.

As understood from above, it is required for the threshold voltage Vth1, the threshold voltage Vth2, and the zero-temperature coefficient voltage $V_{ZTC}$ to have a relationship of Vth1<$V_{ZTC}$<Vth2. In other words, the zero-temperature coefficient voltage $V_{ZTC}$ is lowered to make smaller the area of the positive temperature coefficient, to secure a wide safe operating area.

The reason why it is desirable that the area of the first base region 16a is one-half or smaller of the second base region 16b is as follows. In the $V_g$-to-$I_D$ curves in a typical trench MOSFET shown in FIG. 5, there is an experimental fact that the drain current $I_D$ at a point ZTC, where the temperature coefficient of the drain current $I_D$ changes from a positive to a negative coefficient, and vice versa, is three times or more larger than a current (rated current) in the safe operating area in an area of low drain voltage $V_D$. Based on the above experimental fact, it is required to limit the region of the threshold voltage Vth1, at which an MOSFET channel turns on with a low gate voltage $V_G$, to one-half or smaller of the region of the threshold voltage Vth2, in order to lower the point ZTC than the rated current.

Subsequently, an example of the fabrication process of the semiconductor device 1 according to the present embodiment will be explained based on FIGS. 9A and 9B to FIGS. 20A and 20B. FIG. 9A to FIG. 20A (only the figures given the sign A) are sectional views of the semiconductor device 1 in the orthogonal-to-trench direction, corresponding to the above-described FIG. 1. FIG. 9B to FIG. 20B (only the figures given the sign B) are sectional views of the semiconductor device 1 in a parallel-to-trench longitudinal direction, corresponding to the above-described FIG. 2.

First of all, as shown in FIGS. 9A and 9B, an n⁻-type semiconductor layer 14X is formed on an n⁺-type semiconductor substrate 12X. The semiconductor substrate 12X becomes the above-described drain region 12 and the semiconductor layer 14X becomes the above-described drift region 14.

Figure 11A:
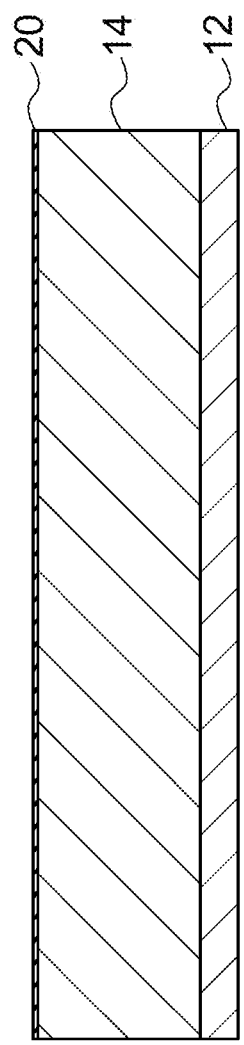
FIGS. 11A and 11B are illustrations explaining part of the fabrication process of the semiconductor device according to the first embodiment.
Figure 11B:
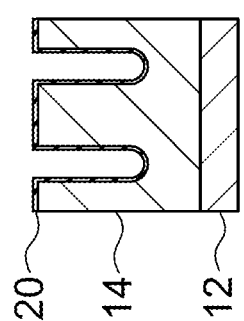

Subsequently, as shown in FIGS. 10A and 10B, a plurality of trenches 50 are formed in the drift region 14. Succeedingly, as shown in FIGS. 11A and 11B, a gate insulating film 20 is formed on the surface of the drift region 14 including the trenches 50, for example, by thermal oxidation.

Figure 12A:
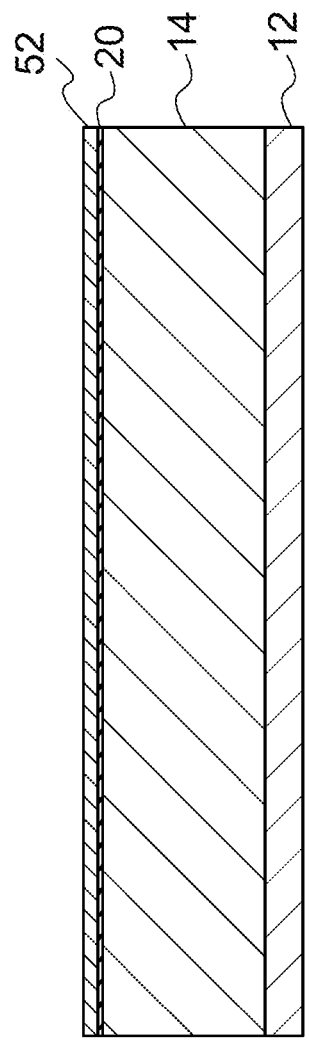
FIGS. 12A and 12B are illustrations explaining part of the fabrication process of the semiconductor device according to the first embodiment.
Figure 12B:
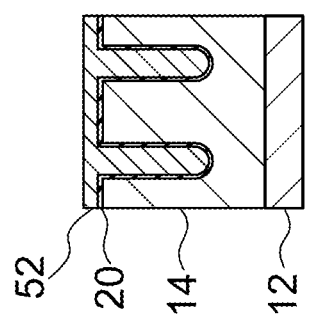

Subsequently, as shown in FIGS. 12A and 12B, for example, polysilicon 52 is deposited on the gate insulating film 20, so that the polysilicon 52 is embedded to fill the trenches 50. Succeedingly, as shown in FIGS. 13A and 13B, the polysilicon 52 is selectively etched, for example, by CDE (Chemical Dry Etching) or RIE (Reactive Ion Etching) so that the polysilicon 52 remains in the trenches 50 whereas the polysilicon 52 in the other regions is removed. Then, gate electrodes 18 are formed with the polysilicon 52 remaining in the trenches 50.

Subsequently, as shown in FIGS. 14A and 14B, a base region 54 is formed in the drift region 14, for example, by ion implantation of boron (B) to the drift region 14. The boron ion implantation is performed to the entire surface of the drift region 14, the concentration thereof being the amount required to have the threshold voltage Vth1.

Subsequently, as shown in FIGS. 15A and 15B, photoresist 52 is formed on the portion corresponding to the first base region 16a and, again, for example, by ion implantation of boron (B), the first and second base regions 16a and 16b are formed from the base region 54, the concentration of the additional ion implantation being the amount required for the base region 54 to have the threshold voltage Vth2. In other words, the second base region 16b having the threshold voltage Vth2 is formed with the total concentration in the ion implantation performed in FIGS. 14A and 14B, and in FIGS. 15A and 15B. The first base region 16a having the threshold voltage Vth1 is formed in the region with no additional ion implantation in the base regions 54.

Subsequently, as shown in FIGS. 16A and 16B, the photoresist 52 is removed and then ion implantation of phosphorus (P) or arsenic (As) is performed above the first and second base regions 16a and 16b to form an n⁺-type semiconductor region 22X.

Figure 17B:
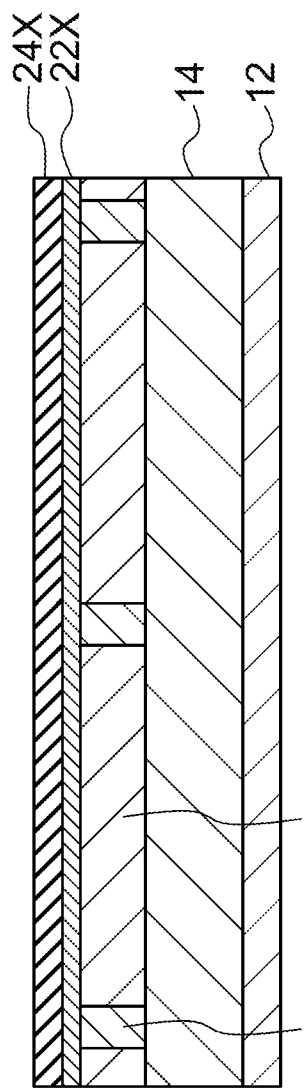
FIGS. 17A and 17B are illustrations explaining part of the fabrication process of the semiconductor device according to the first embodiment.
Figure 17A:
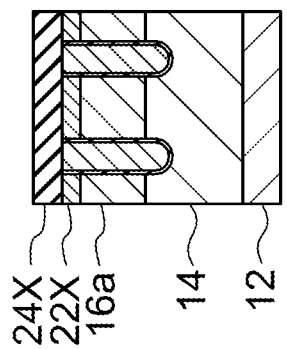
Figure 18B:
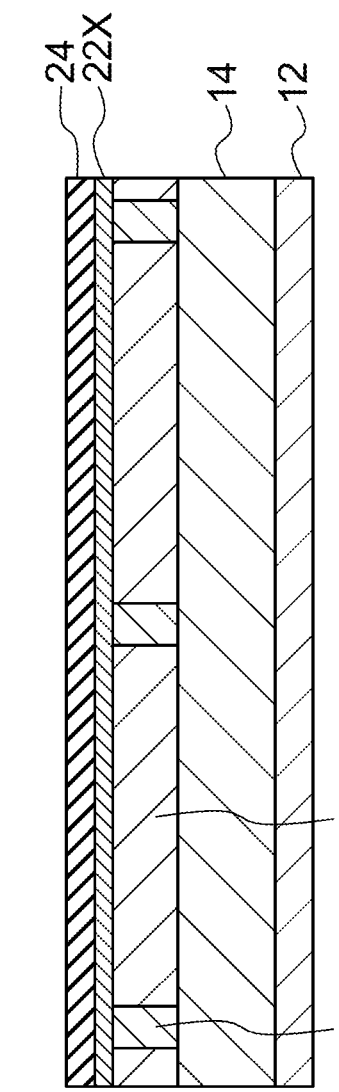
FIGS. 18A and 18B are illustrations explaining part of the fabrication process of the semiconductor device according to the first embodiment.
Figure 18A:
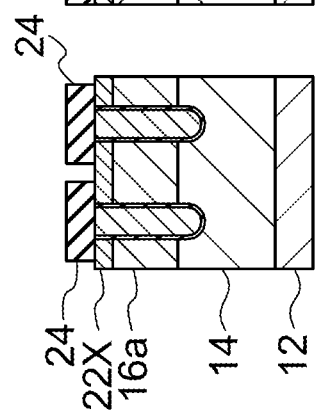

Subsequently, as shown in FIGS. 17A and 17B, an insulating film 24X is formed on the semiconductor region 22X, for example, by CVD (Chemical Vapor Deposition). Succeedingly, as shown in FIGS. 18A and 17B, the insulating film 24X is patterned by, for example, RIE to form an insulating film 24.

Subsequently, as shown in FIGS. 19A and 19B, the semiconductor region 22X and the base regions 54 are etched by, for example, RIE, using the insulating film 24X as a mask, to form a trench 30. Then, a source region 22 is formed with the etched semiconductor region 22X. Succeedingly, as shown in FIGS. 20A and 20B, ion implantation of, for example, boron (B), is performed to form contact regions 28 in the first and second base regions 16a and 16b which are exposed in the bottom of the trench 30, respectively. In the formation of the contact regions 28, thermal diffusion is performed after the ion implantation to recover the crystals of the first and second base regions 16a and 16b, and activate impurity ions.

Subsequently, as shown in FIGS. 1 and 2, the source electrode 26 is formed on the insulating regions 24 to fill the trench 30, followed by the drain electrode 10 under the drain region 12. Specifically, for example, front surface metal is formed and processed to form a passivation film, followed by wafer thinning, thereby the source electrode 26 being formed, with the drain electrode 10 being formed with formation of rear surface metal, thereby the semiconductor device 1 shown in FIGS. 1 to 3 being obtained.

The drain region 12 and/or the drift region 14 according to the present embodiment correspond(s) to a first semiconductor. The vertical direction in FIG. 1 of the semiconductor device 1 according to the present embodiment corresponds to a first direction. The depth direction in FIG. 2 of the semiconductor device 1 according to the present embodiment corresponds to a second direction. The width direction in FIG. 1 of the semiconductor device 1 according to the present embodiment corresponds to a third direction. The portion of the source electrode 26 embedded in the trench 30 according to the present embodiment constitutes a body contact that electrically connects the source electrode 26 to the source region 22 and the base region 16.

As described above, in the semiconductor device 1 according to the present embodiment, the first base region 16a of low impurity concentration and the second base region 16b of high impurity concentration are formed in the base region 16 of each cell C, to configure MOSFET channels, one of the MOSFET channels turning into the on-state at the threshold voltage Vth1 lower than the threshold voltage Vth2 of the other MOSFET channel formed in the second base region 16b. Therefore, the drain current $I_D$ can be kept low when the gate voltage $V_G$ is at a level between the threshold voltages Vth1 and Vth2, and hence an area of a positive temperature coefficient can be smaller. Therefore, it is achieved to restrict the occurrence of thermal runaway in the semiconductor device 1 to widen the safe operating area.

When the gate voltage $V_G$ becomes higher than the threshold voltage Vth2, the MOSFET channels in both of the first and second base regions 16a and 16b turn into the on-state, thereby a channel being formed in the entire base region 16 to reduce the on-resistance. Moreover, the first base regions 16a of the further lower threshold voltage Vth1 are dispersedly arranged in the semiconductor device 1, so that the generation of heat can be dispersed entirely inside the semiconductor device 1, thereby widening the safe operating area.

Second Embodiment

In the above-described first embodiment, the dose amount in ion implantation to the base region 16 in the fabrication process is increased so that the second base region 16b has higher impurity concentration than the first base region 16a. By contrast, in the second embodiment, the contact region 28 located in the second base region 16b is formed to have a larger width so that the second base region 16b has higher impurity concentration than the first base region 16a, utilizing diffusion of impurities that forms the contact region 28. Hereinbelow, the portion of the second embodiment different from the above-described first embodiment will be explained.

Figure 21:
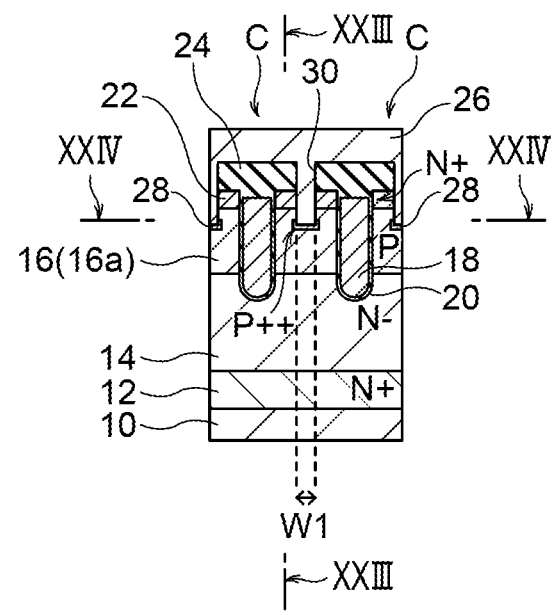
FIG. 21 is a sectional view taken on line XXI-XXI in FIG. 23 of a semiconductor device according to a second embodiment.
Figure 22:
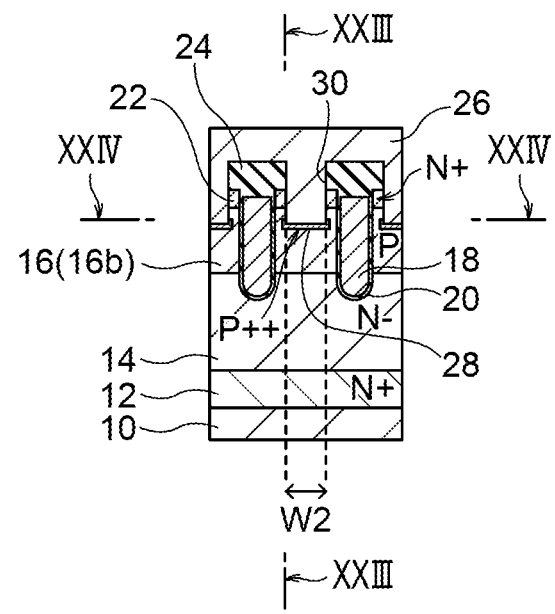
FIG. 22 is a sectional view taken on line XXII-XXII in FIG. 23 of the semiconductor device according to the second embodiment.
Figure 23:
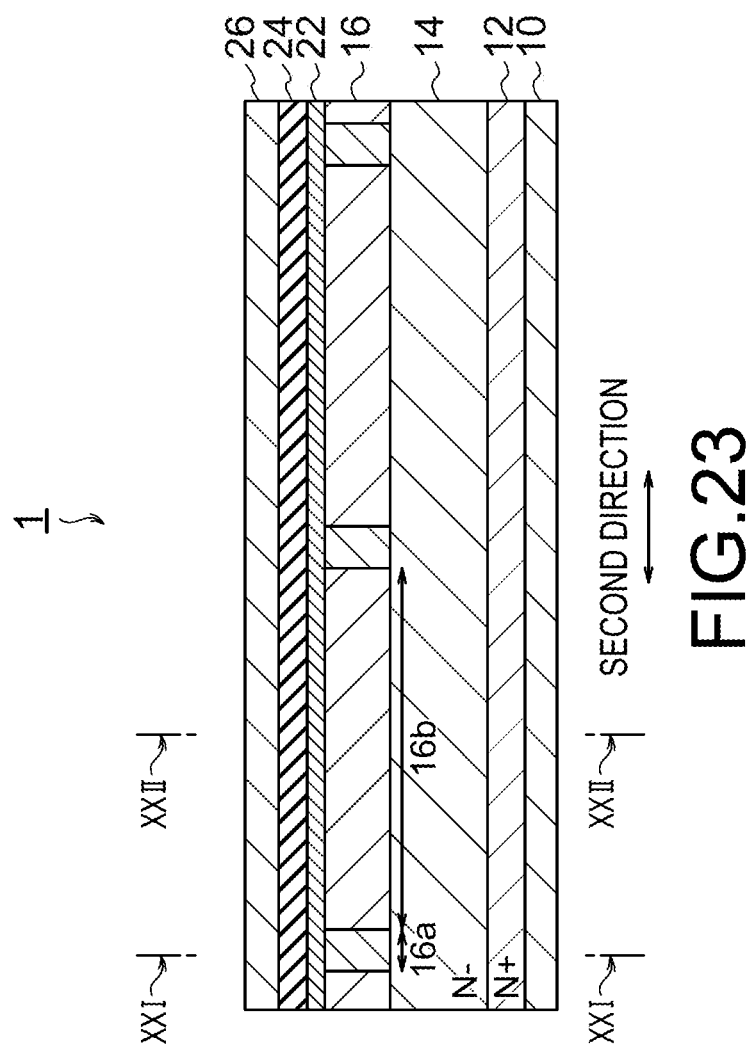
FIG. 23 is a sectional view taken on line XXIII-XXIII in each of FIGS. 21 and 22 of the semiconductor device according to the second embodiment.
Figure 24:
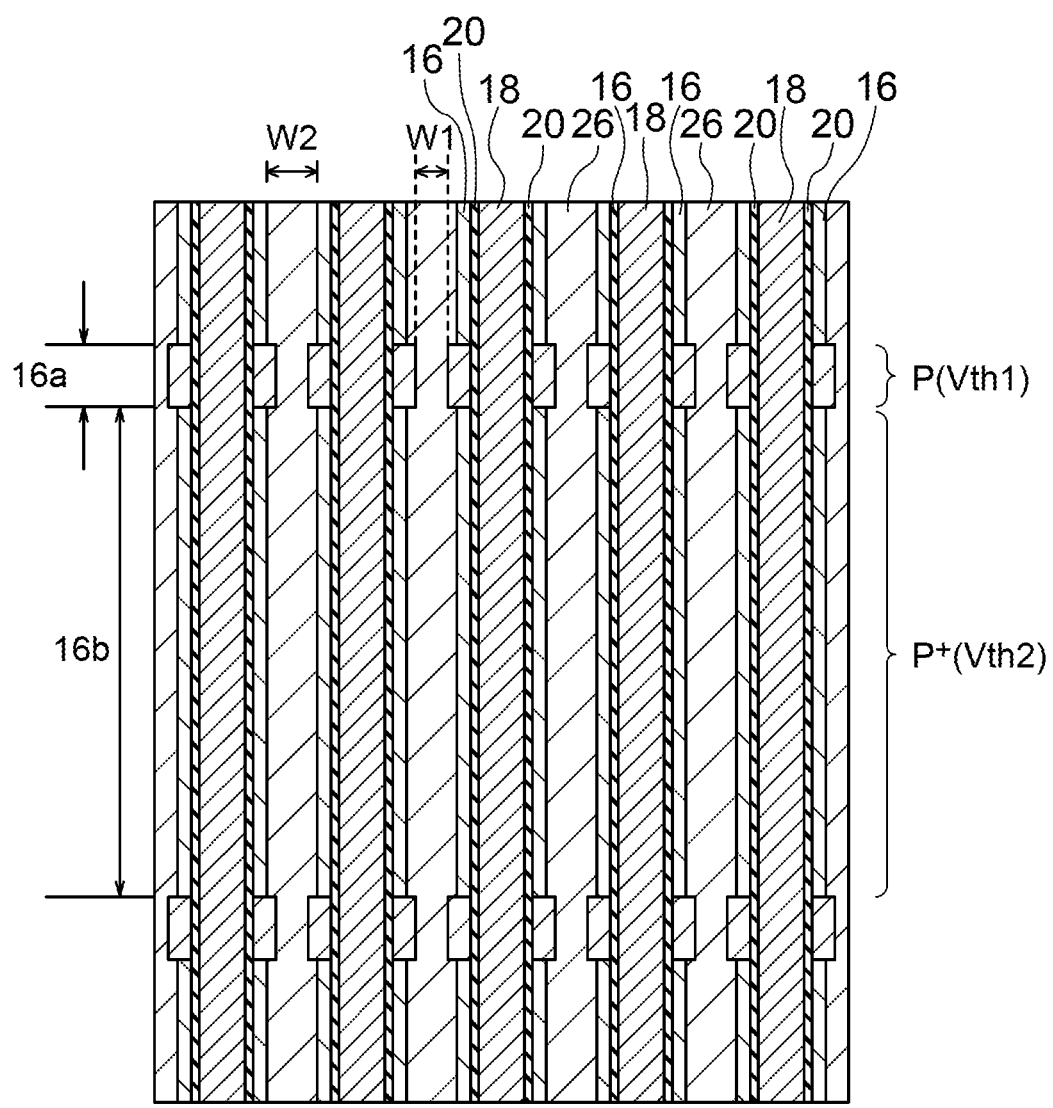
FIG. 24 is a sectional view taken on line XXIV-XXIV in each of FIGS. 21 and 22 of the semiconductor device according to the second embodiment.

FIG. 21 is a sectional view taken on line XXI-XXI in FIG. 23 of a semiconductor device 1 according to the present embodiment. FIG. 22 is a sectional view taken on line XXII-XXII in FIG. 23 of the semiconductor device 1 according to the present embodiment. FIG. 23 is a sectional view taken on line XXIII-XXIII in each of FIGS. 21 and 22 of the semiconductor device 1 according to the present embodiment. FIG. 24 is a sectional view taken on line XXIV-XXIV in each of FIGS. 21 and 22 of the semiconductor device 1 according to the present embodiment. In other words, FIGS. 21 and 22 are sectional views of the semiconductor device 1 in the orthogonal-to-trench direction. FIG. 23 is a sectional view of the semiconductor device 1 in the trench longitudinal direction parallel to trenches. FIG. 24 is a sectional view of the semiconductor device 1 in the front surface direction.

As understood from FIGS. 21 to 24, also in the semiconductor device 1 according to the present embodiment, the first base regions 16a of low impurity concentration are dispersedly formed in the base region 16. However, the contact region 28 is formed to have a larger width in the regions corresponding to the second base regions 16b to give higher impurity concentration with the diffusion of impurities from the contact region 28.

In other words, a width W2 of the contact region 28 formed in each second base region 16b is larger than a width W1 of the contact region 28 formed in each first base region 16a. Therefore, in a thermal diffusion step for forming the contact region 28, impurities of the contact region 28 are diffused to the second base region 16b to raise the impurity concentration of the second base region 16b. Therefore, in the same manner as the above-described first embodiment, it is achieved to form the first base region 16a of low impurity concentration and the second base regions 16b of high impurity concentration in the base region 16. Accordingly, it is achieved to configure a MOSFET channel of the threshold voltage Vth1 in the first base region 16a and a MOSFET channel of the threshold voltage Vth2 higher than the threshold voltage Vth1 in the second base region 16b.

Along with the above, the width of the trenches 30, in each of which the body contact of the source electrode 26 is embedded, is different between the locations corresponding to the first base region 16a and the second base region 16b. In detail, a width W2 of the trench 30 corresponding to the second base region 16b is larger than a width W1 of the trench 30 corresponding to the first base region 16a.

Subsequently, an example of the fabrication process of the semiconductor device 1 according to the present embodiment will be explained based on FIGS. 25A to 25C, to FIGS. 27A to 27C. FIGS. 25A to 27A (only the figures given the sign A) are sectional views of the semiconductor device 1 in the orthogonal-to-trench direction in the first base region 16a, corresponding to the above-described FIG. 21. FIGS. 25B to 27B (only the figures given the sign B) are sectional views of the semiconductor device 1 in the orthogonal-to-trench direction in the second base region 16b, corresponding to the above-described FIG. 22. FIGS. 25C to 27C (only the figures given the sign C) are sectional views of the semiconductor device 1 in the longitudinal direction parallel to trenches, corresponding to the above-described FIG. 23.

The fabrication process of the semiconductor device 1 according to the present embodiment is the same as the above-described first embodiment, up to the above-described FIGS. 9A and 9B to FIGS. 14A and 14B, without requiring the ion implantation step of FIGS. 15A and 15B, and also the same as the first embodiment on the steps of 16A and 16B, and FIGS. 17A and 17B.

After the fabrication step of FIGS. 17A and 17B, as shown in FIGS. 25A to 25C, the insulating film 24X is patterned by RIE to form insulating regions 24. In this patterning, the insulating regions 24 are formed to have a width W1 for the gap between the insulating regions 24 located in the first base regions 16a and a width W2, larger than the width W1, for the gap between the insulating regions 24 located in the second base regions 16b.

Figure 26A:
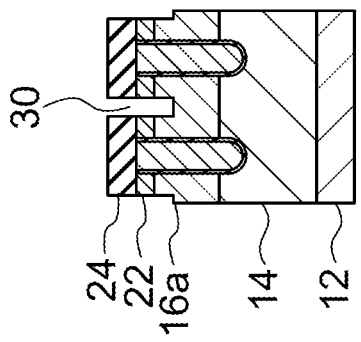
FIGS. 26A, 26B and 26C are illustrations explaining part of the fabrication process of the semiconductor device according to the second embodiment.
Figure 26B:
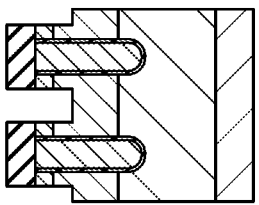
Figure 26C:
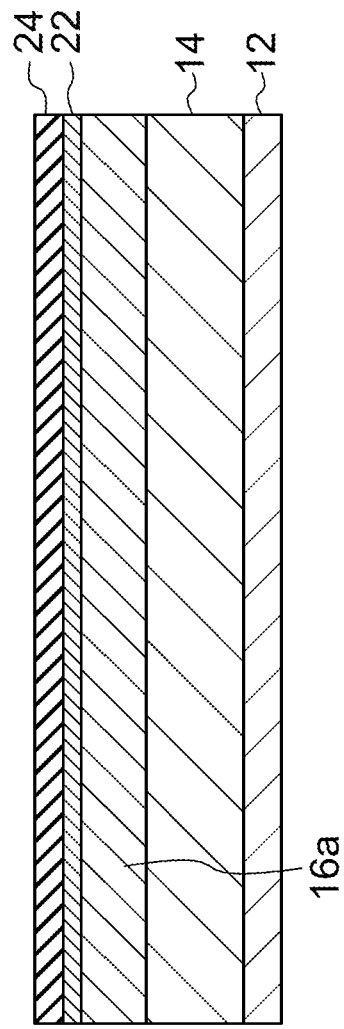

Subsequently, as shown in FIGS. 26A to 26C, the semiconductor region 22X and the base regions 54 are etched by, for example, RIE, using the insulating regions 24 as a mask, to form the trenches 30. Then, the source regions 22 are formed with the etched semiconductor region 22X.

Succeedingly, as shown in FIGS. 27A to 27C, ion implantation of, for example, boron (B), is performed to form contact regions 28 in the base regions 54 which are exposed in the bottom of the trenches 30, respectively. In the formation of the contact regions 28, thermal diffusion is performed after the ion implantation. Therefore, in the region where the second base region 16b is formed, since each trench 30 has been formed with a further large width W2, the base region 54 has higher impurity concentration due to thermal diffusion of impurities such as boron. Therefore, it is achieved to form the second base region 16b with higher impurity concentration than the first base region 16a having the contact region 28 of a further smaller width W1. Thereafter, the source electrode 26 and the drain electrode 10 are formed in the same steps as the those of the above-described first embodiment, as shown in FIGS. 21 to 23.

As described above, also in the semiconductor device 1 according to the present embodiment, the first base region 16a of low impurity concentration and the second base region 16b of high impurity concentration are formed in the base region 16 of one cell C, to configure MOSFET channels, one of the MOSFET channels turning into the on-state at the threshold voltage Vth1 lower than the threshold voltage Vth2 of the other MOSFET channel formed in the second base region 16b. Therefore, the drain current $I_D$ can be kept low when the gate voltage VG is at a level between the threshold voltages Vth1 and Vth2, and hence an area of a positive temperature coefficient can be smaller. Therefore, it is achieved to restrict the occurrence of thermal runaway in the semiconductor device 1 to widen the safe operating area.

When the gate voltage $V_G$ becomes higher than the threshold voltage Vth2, the MOSFET channels in both of the first and second base regions 16a and 16b turn into the on-state, thereby a channel being formed in the entire base region 16 to reduce the on-resistance. Moreover, the first base regions 16a of the further lower threshold voltage Vth1 are dispersedly arranged in the semiconductor device 1, so that the generation of heat can be dispersed entirely inside the semiconductor device 1, thereby widening the safe operating area.

Moreover, in the fabrication process of the semiconductor device 1, it is not required to perform ion implantation of different dose amounts because of photolithography and ion implantation, thereby achieving a simplified fabrication process. In detail, as shown in FIG. 25A to 27C, a photoresist is exposed to the pattern of the trenches 30 to perform patterning of the insulating film 24X to form the trenches 30, followed by the formation of the contact region 28 in the bottom of each trench 30 by ion implantation, thereby achieving the formation of the second base regions 16b of high impurity concentration. Therefore, it is not required to perform ion implantation of different dose amounts. In other words, the ion implantation step of FIGS. 15A and 15B in the first embodiment is not required. Accordingly, it is achieved to reduce the number of patterns in the photomask and hence reduce the number of ion implantation steps.

Third Embodiment

In the above-described second embodiment, the width W2 of the contact region 28 corresponding to each second base region 16b is made larger than the width W1 of the contact region 28 corresponding to each first base region 16a, so that the threshold voltage Vth2 of the MOSFET channel corresponding to the second base region 16b is higher than the threshold voltage Vth1 of the MOSFET channel corresponding to the first base region 16a. Different from above, in the third embodiment, the location of the contact region 28 in the first base region 16a is shifted in a direction so as to be apart from the gate electrode 18, to lower the impurity concentration of the first base region 16a. Hereinbelow, the portion of the third embodiment different from the above-described first and second embodiments will be explained.

Figure 28:
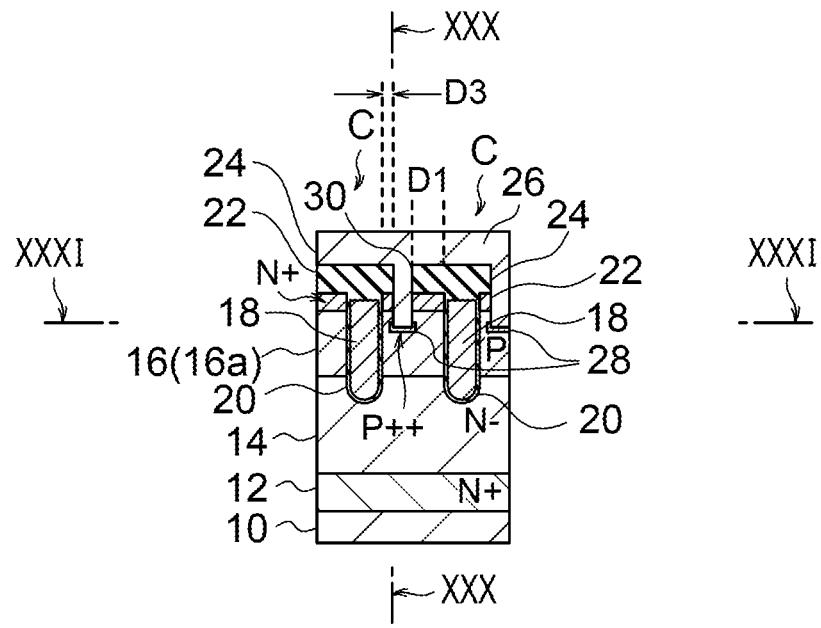
FIG. 28 is a sectional view taken on line XXVII-XXVII in FIG. 30 of a semiconductor device according to a third embodiment.
Figure 29:
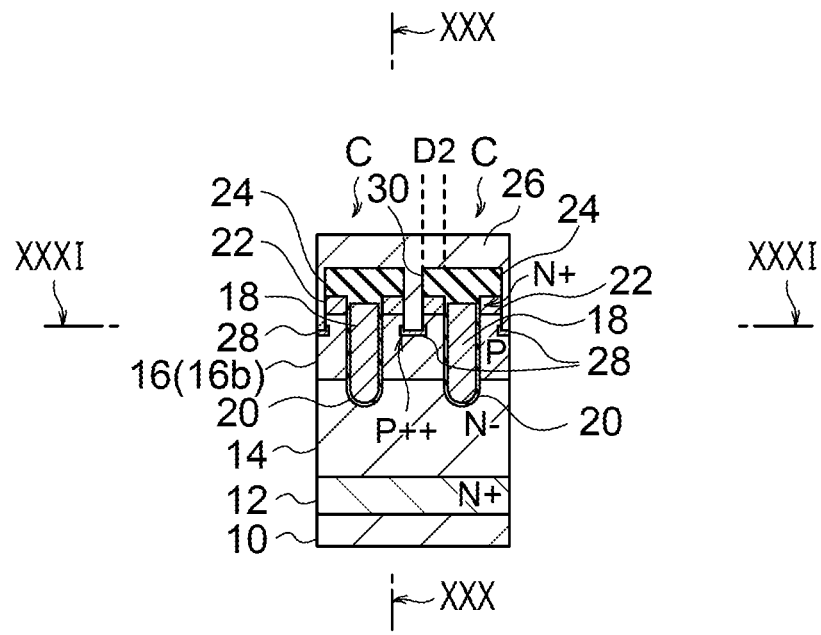
FIG. 29 is a sectional view taken on line XXIX-XXIX in FIG. 30 of the semiconductor device according to the third embodiment.
Figure 30:
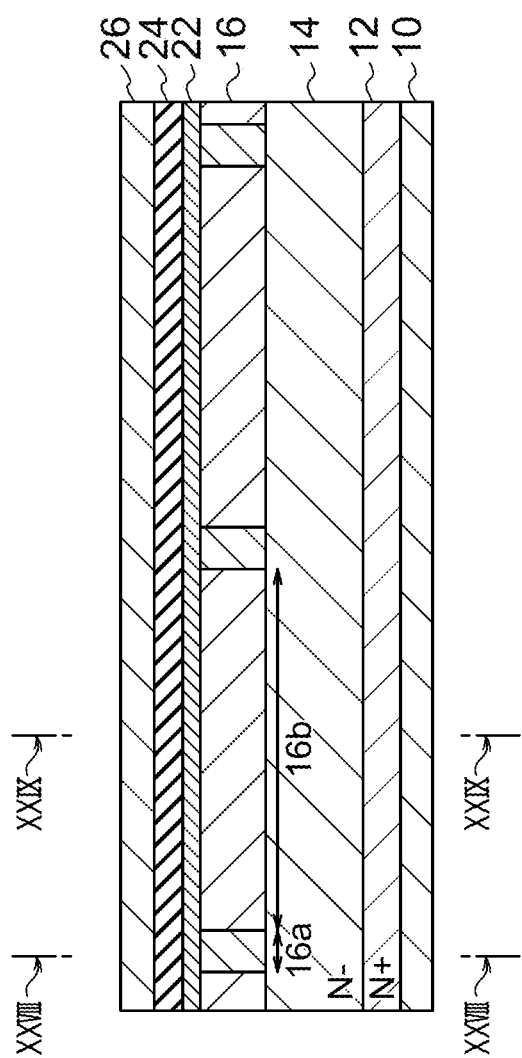
FIG. 30 is a sectional view taken on line XXX-XXX in each of FIGS. 28 and 29 of the semiconductor device according to the third embodiment.
Figure 31:
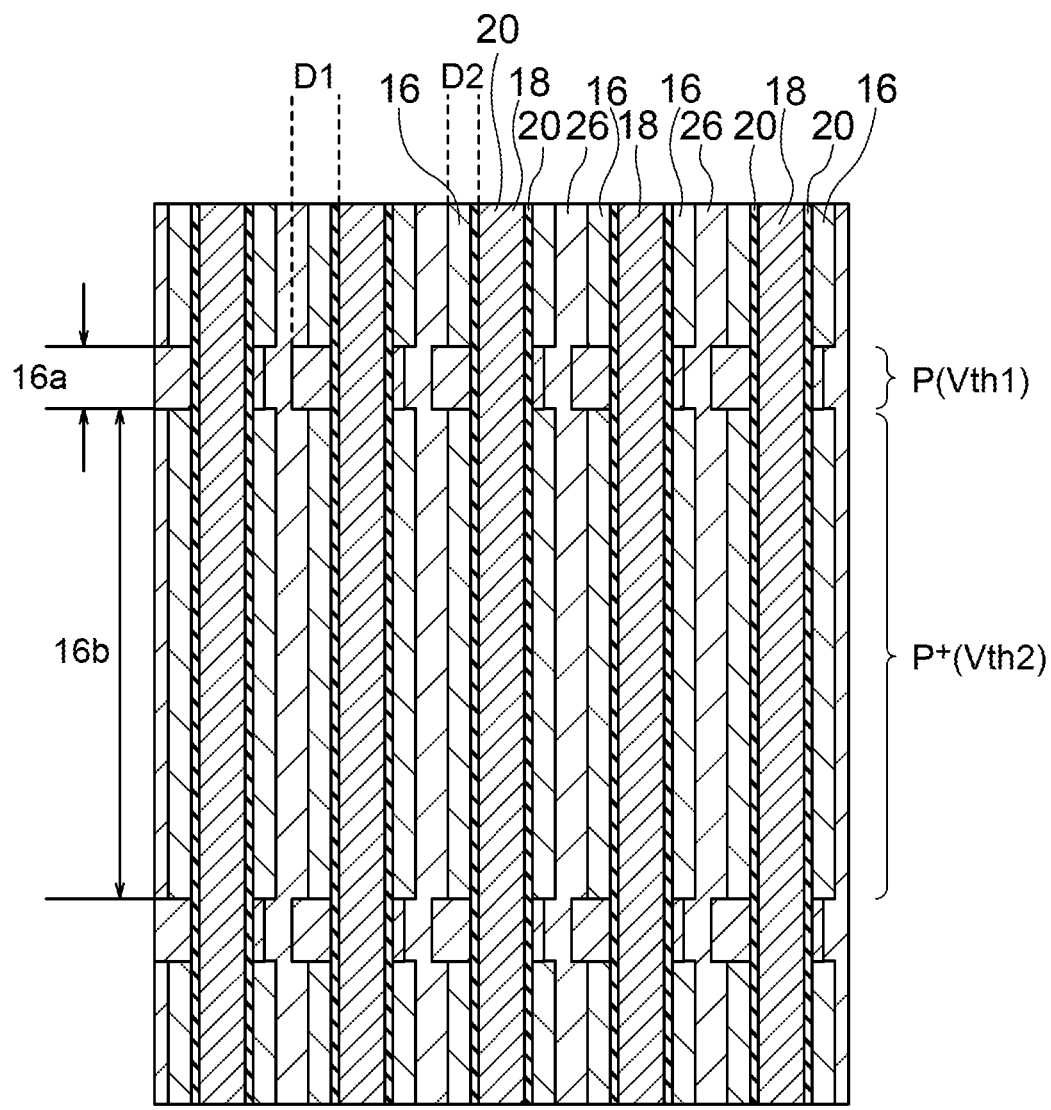
FIG. 31 is a sectional view taken on line XXXI-XXXI in each of FIGS. 28 and 29 of the semiconductor device according to the third embodiment.

FIG. 28 is a sectional view taken on line XXVIII-XXVIII in FIG. 30 of a semiconductor device 1 according to the present embodiment. FIG. 29 is a sectional view taken on line XXIX-XXIX in FIG. 30 of the semiconductor device 1 according to the present embodiment. FIG. 30 is a sectional view taken on line XXX-XXX in each of FIGS. 28 and 29 of the semiconductor device 1 according to the present embodiment. FIG. 31 is a sectional view taken on line XXXI-XXXI in each of FIGS. 28 and 29 of the semiconductor device 1 according to the present embodiment. In other words, FIGS. 28 and 29 are sectional views of the semiconductor device 1 in the orthogonal-to-trench direction. FIG. 30 is a sectional view of the semiconductor device 1 in the trench longitudinal direction parallel to trenches. FIG. 31 is a sectional view of the semiconductor device 1 in the front surface direction.

As understood from FIGS. 28 to 31, also in the semiconductor device 1 according to the present embodiment, the first base regions 16a of low impurity concentration are dispersedly formed in the base region 16. However, in the region corresponding to each first base region 16a, the location of the contact region 28 is shifted in a direction so as to be apart from the gate electrode 18, more than in the region corresponding to each second base region 16b, to lower the impurity concentration of the first base region 16a.

In detail, as shown in FIGS. 29 and 31, the contact region 28 corresponding to each second base region 16b is formed between two gate electrodes 18, whereas, as shown in FIGS. 28 and 31, the contact region 28 corresponding to each first base region 16a is formed closer to either one of the gate electrodes 18. Specifically, a distance D1 between the gate electrode 18 and the contact region 28 in the first base region 16a is larger than a distance D2 between the gate electrode 18 and the contact region 28 in the second base region 16b. In other words, as understood from FIG. 31, in the location corresponding to the first base region 16a, the trench 30 is formed apart from the gate electrode 18 by the distance D1 to form the contact region 28, whereas in the location corresponding to the second base region 16b, the trench 30 is formed apart from the gate electrode 18 by the distance D2 smaller than the distance D1 to form the contact region 28. Therefore, the impurity concentration of the first base region 16a is lower than the impurity concentration of the second base region 16b, and, as a result, the threshold voltage Vth1 of the MOSFET channel corresponding to the first base region 16a is lower than the threshold voltage Vth2 of the MOSFET channel corresponding to the second base region 16b.

As shown in FIG. 28, the distance between the gate electrode 18 and the contact region 28 in the first base region 16a is a distance D3 at the opposite side of the trench 30 with respect to the distance sign D1 in FIG. 28, so that the distance from the contact region 28 to the gate electrode 18 in the first base region 16a is smaller than the distance from the contact region 28 to the gate electrode 18 in the second base region 16b, showing a relationship of distance D1>distance D2>distance D3. Therefore, the MOSFET channel with the distance D3 to the gate electrode 18 has the highest threshold voltage. However, the threshold voltage of the MOSFET channel in the first base region 16a is determined according to the distance D1 with low impurity concentration. In other words, since the MOSFET channel with the distance D1 to the gate electrode 18 turns into the on-state at the threshold voltage Vth1, when the entire semiconductor device 1 is considered, it can be said that the MOSFET channels having threshold voltage Vth1 are formed in the first base regions 16a.

Subsequently, an example of the fabrication process of the semiconductor device 1 according to the present embodiment will be explained based on FIGS. 32A to 32C, to FIGS. 34A to 34C. FIGS. 32A to 34A (only the figures given the sign A) are sectional views of the semiconductor device 1 in the orthogonal-to-trench direction in the first base region 16a, corresponding to the above-described FIG. 28. FIG. 32B to 34B (only the figures given the sign B) are sectional views of the semiconductor device 1 in the orthogonal-to-trench direction in the second base region 16b, corresponding to the above-described FIG. 29. FIGS. 32C to 34C (only the figures given the sign C) are sectional views of the semiconductor device 1 in the longitudinal direction parallel to trenches, corresponding to the above-described FIG. 30.

The fabrication process of the semiconductor device 1 according to the present embodiment is the same as the above-described second embodiment, up to the above-described FIGS. 17A and 17B. After the fabrication step of FIGS. 17A and 17B, as shown in FIGS. 32A to 32C, for example, the insulating film 24X is patterned by RIE to form the insulating regions 24. In this patterning, the insulating regions 24 are formed to have a distance D1 from one of the gate electrodes 18 to a gap 30x between the insulating regions 24 in the region corresponding to the first base regions 16a and a distance D2 from each of two gate electrodes 18 to the gap 30x between the insulating regions 24 in the region corresponding to the second base region 16b.

Subsequently, as shown in FIGS. 33A to 33C, the semiconductor region 22X and the base regions 54 are etched by, for example, RIE, using the insulating regions 24 as a mask, to form the trenches 30. Then, the source regions 22 are formed with the etched semiconductor region 22X.

Succeedingly, as shown in FIGS. 34A to 34C, ion implantation of, for example, boron (B), is performed to form the contact regions 28 in the base regions 54 which are exposed in the bottom of the trenches 30, respectively. In the formation of the contact regions 28, thermal diffusion is performed after the ion implantation. In this step, since each contact region 28 is formed with the distance D2 smaller than the distance D1 in the second base region 16b, the base region 54 has higher impurity concentration due to thermal diffusion. On the other hand, in the region where the first base region 16a is formed, since each contact region 28 is formed with the distance D1 larger than the distance D2, the impurity concentration due to thermal diffusion is not so high compared to the second base region 16b. Therefore, the first base region 16a has lower impurity concentration than the second base region 16b.

Through the above thermal diffusion step, the impurity concentration of the first base region 16a and the impurity concentration of the second base region 16b are adjusted so that the MOSFET channel in the region corresponding to the first base region 16a has a threshold voltage Vth1 and the MOSFET channel in the region corresponding to the second base region 16b has a threshold voltage Vth2. Thereafter, the source electrode 26 and the drain electrode 10 are formed in the same steps of the above-described first embodiment, as shown in FIGS. 21 to 23, thereby obtaining the semiconductor device 1.

As described above, also in the semiconductor device 1 according to the present embodiment, the first base region 16a of low impurity concentration and the second base region 16b of high impurity concentration are formed in the base region 16 of one cell C, to configure MOSFET channels, one of the MOSFET channels turning into the on-state at the threshold voltage Vth1 lower than the threshold voltage Vth2 of the other MOSFET channel formed in the second base region 16b. Therefore, the drain current $I_D$ can be kept low when the gate voltage $V_G$ is at a level between the threshold voltages Vth1 and Vth2, and hence an area of a positive temperature coefficient can be smaller. Therefore, it is achieved to restrict the occurrence of thermal runaway in the semiconductor device 1 to widen the safe operating area.

When the gate voltage $V_G$ becomes higher than the threshold voltage Vth2, the MOSFET channels in both of the first and second base regions 16a and 16b turn into the on-state, thereby a channel being formed in the entire base region 16 to reduce the on-resistance. Moreover, the first base regions 16a of the further lower threshold voltage Vth1 are dispersedly arranged in the semiconductor device 1, so that the generation of heat can be dispersed entirely inside the semiconductor device 1, thereby widening the safe operating area.

Moreover, in the fabrication process of the semiconductor device 1, it is not required to perform ion implantation of different dose amounts because of photolithography and ion implantation, thereby achieving a simplified fabrication process. In detail, a photoresist is exposed to the pattern of the trenches 30 formed at the shifted locations to perform etching, followed by the formation of the contact region 28 in the bottom of each trench 30 by ion implantation with thermal diffusion, thereby achieving the formation of the first base regions 16a of low impurity concentration. Therefore, it is not required to perform ion implantation of different dose amounts. Accordingly, it is achieved to reduce the number of patterns in the photomask and hence reduce the number of ion implantation steps.

In the present embodiment, each contact region 28 is formed between two gate electrodes 18 in the region corresponding to the second base region 16b. The expression "between" does not necessarily mean the middle. In other words, also in the second base region 16b, the contact region 28 may be formed at a location shifted to either one of the gate electrodes 18. As a result, it is sufficient that the distance D1 from the gate electrode 18 to the contact region 28 in the first base region 16a is larger than the distance D2 from the gate electrode 18 to the contact region 28 in the second base region 16b.

Fourth Embodiment

In the above-described first to third embodiments, each first base region 16a has lower impurity concentration than each second base region 16b so that the threshold voltage Vth1 of the MOSFET channel corresponding to the first base region 16a becomes lower than the threshold voltage Vth2 of the MOSFET channel corresponding to the second base region 16b. By contrast, in the fourth embodiment, each first base region 16a is formed shallower than each second base region 16b so that the threshold voltage Vth1 of the MOSFET channel corresponding to the first base region 16a becomes lower than the threshold voltage Vth2 of the MOSFET channel corresponding to the second base region 16b. Hereinbelow, the portion of the fourth embodiment different from the above-described first embodiment will be explained.

Figure 35:
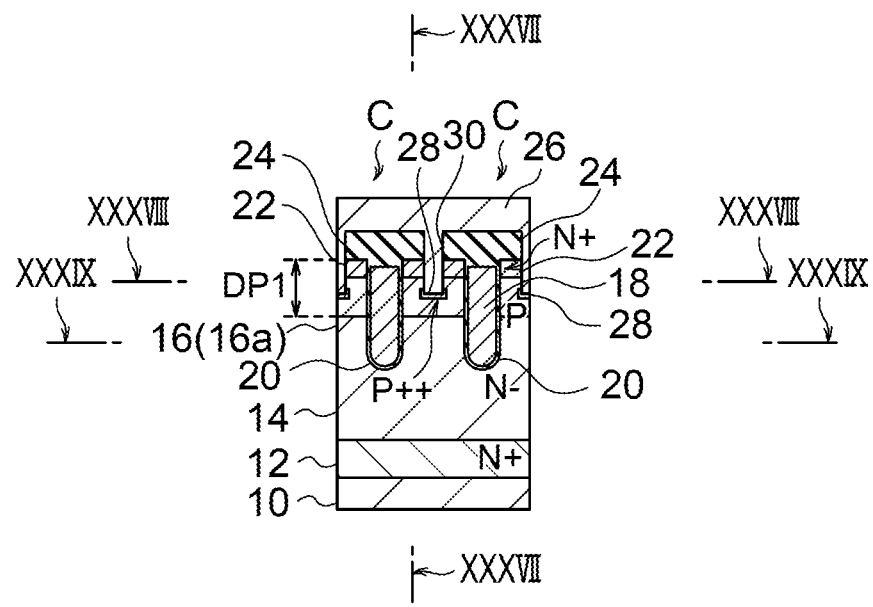
FIG. 35 is a sectional view taken on line XXXV-XXXV in FIG. 37 of a semiconductor device according to a fourth embodiment.
Figure 36:
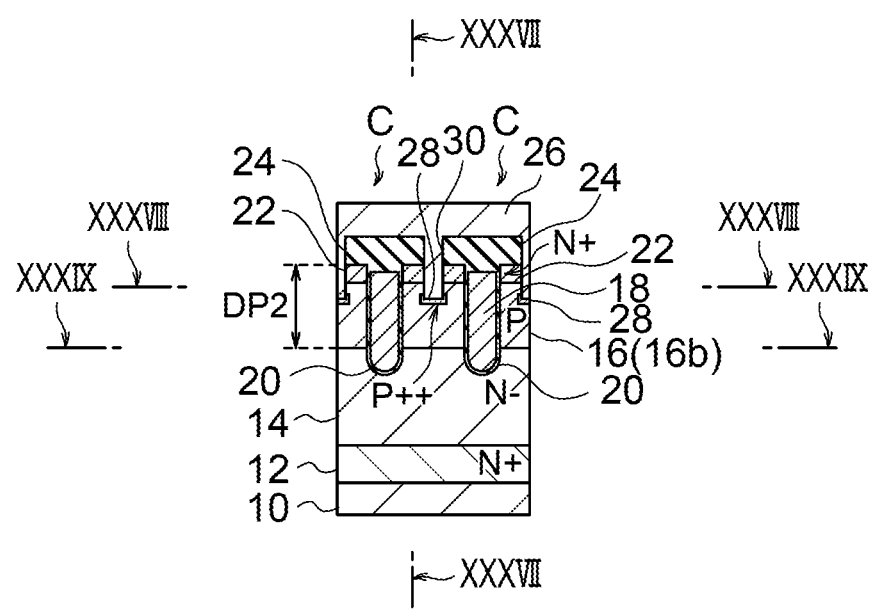
FIG. 36 is a sectional view taken on line XXXVI-XXXVI in FIG. 37 of the semiconductor device according to the fourth embodiment.
Figure 37:
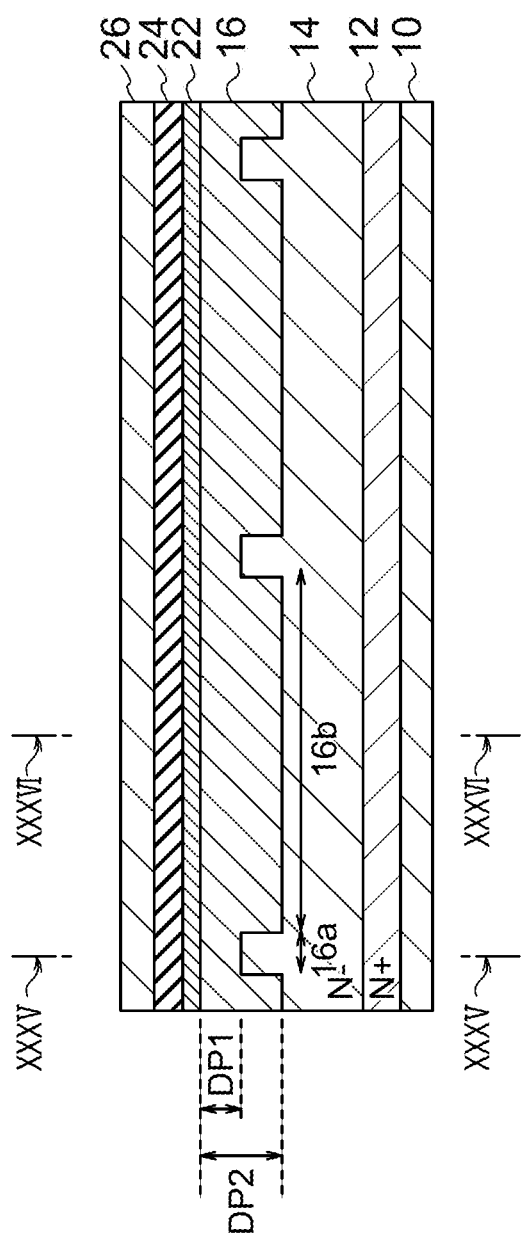
FIG. 37 is a sectional view taken on line XXXVII-XXXVII in each of FIGS. 35 and 36 of the semiconductor device according to the fourth embodiment.
Figure 38:
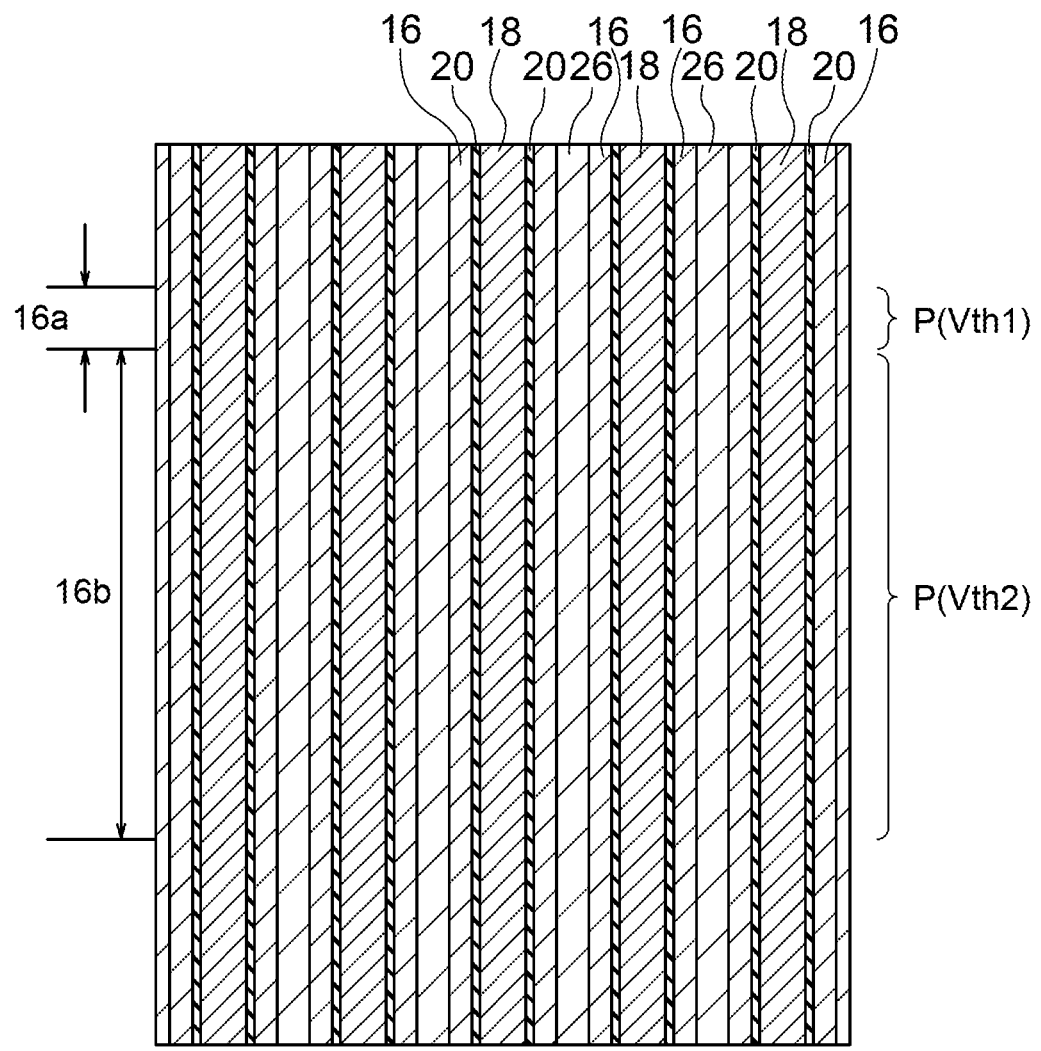
FIG. 38 is a sectional view taken on line XXXVIII-XXXVIII in each of FIGS. 35 and 36 of the semiconductor device according to the fourth embodiment.
Figure 39:
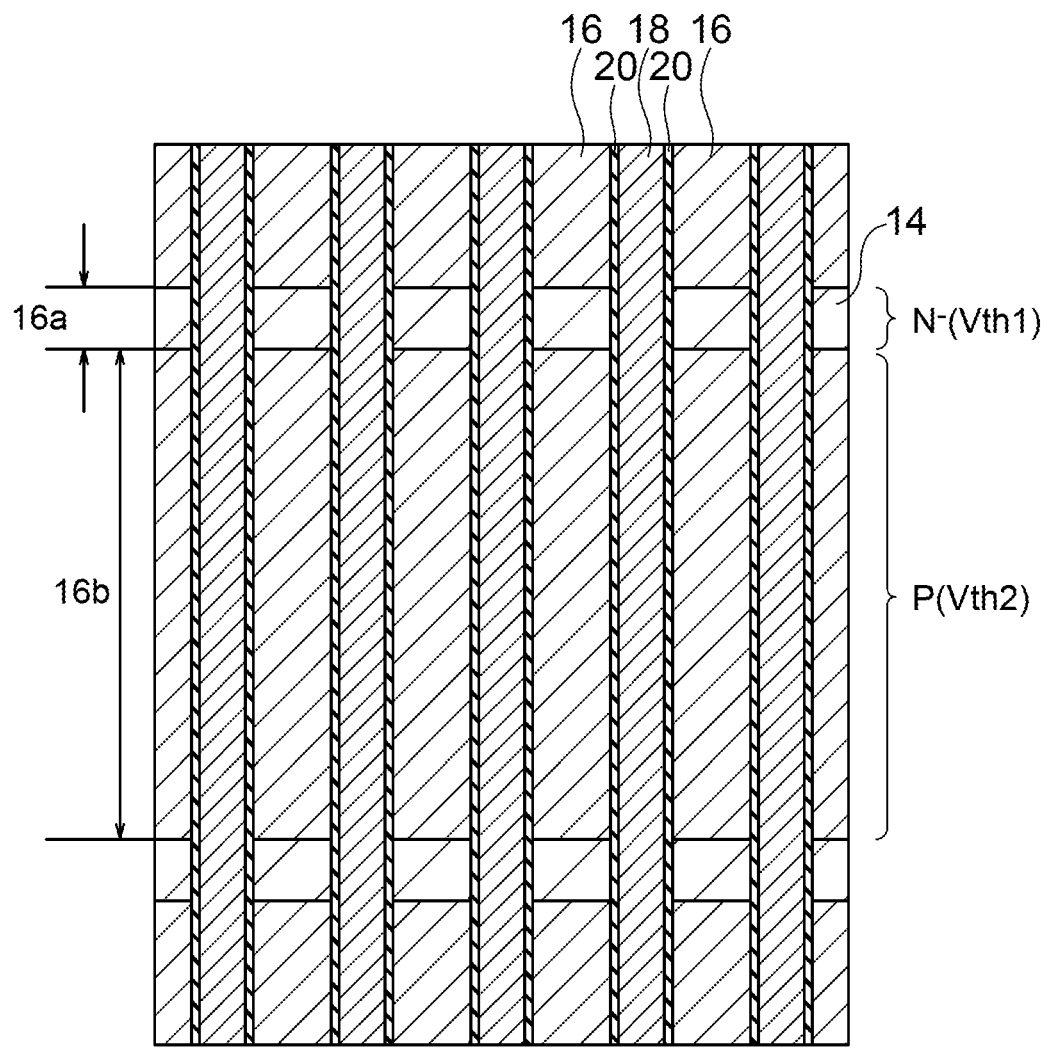
FIG. 39 is a sectional view taken on line XXXIX-XXXIX in each of FIGS. 35 and 36 of the semiconductor device according to the fourth embodiment.

FIG. 35 is a sectional view taken on line XXXV-XXXV in FIG. 37 of a semiconductor device 1 according to present embodiment. FIG. 36 is a sectional view taken on line XXXVI-XXXVI in FIG. 37 of the semiconductor device 1 according to the present embodiment. FIG. 37 is a sectional view taken on line XXXVII-XXXVII in each of FIGS. 35 and 36 of the semiconductor device 1 according to the present embodiment. FIG. 38 is a sectional view taken on line XXXVIII-XXXVIII in each of FIGS. 35 and 36 of the semiconductor device 1 according to the present embodiment. FIG. 39 is a sectional view taken on line XXXIX-XXXIX in each of FIGS. 35 and 36 of the semiconductor device 1 according to the present embodiment. In other words, FIGS. 35 and 36 are sectional views of the semiconductor device 1 in the orthogonal-to-trench direction. FIG. 37 is a sectional view of the semiconductor device 1 in the trench longitudinal direction parallel to trenches. FIGS. 38 and 39 are sectional views of the semiconductor device 1 in the front surface direction.

As understood from FIGS. 35 to 39, in the semiconductor device 1 according to the present embodiment, a depth DP2 at which each second base region 16b is formed is deeper than a depth DP1 at which each first base region 16a is formed. Therefore, the MOSFET channel corresponding to the first base region 16a has a shorter channel than the MOSFET channel corresponding to the second base region 16b. As a result, the threshold voltage Vth1 of the MOSFET channel corresponding to the first base region 16a is lower than the threshold voltage Vth2 of the MOSFET channel corresponding to the second base region 16b.

Figure 40:
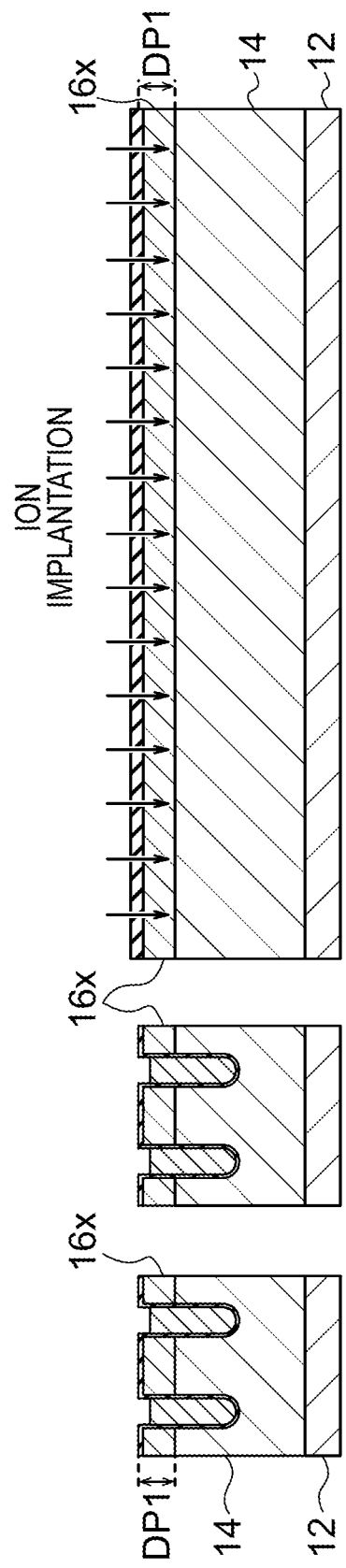
FIGS. 40A, 40B and 40C are illustrations explaining part of a fabrication process of the semiconductor device according to the fourth embodiment.
Figure 41:
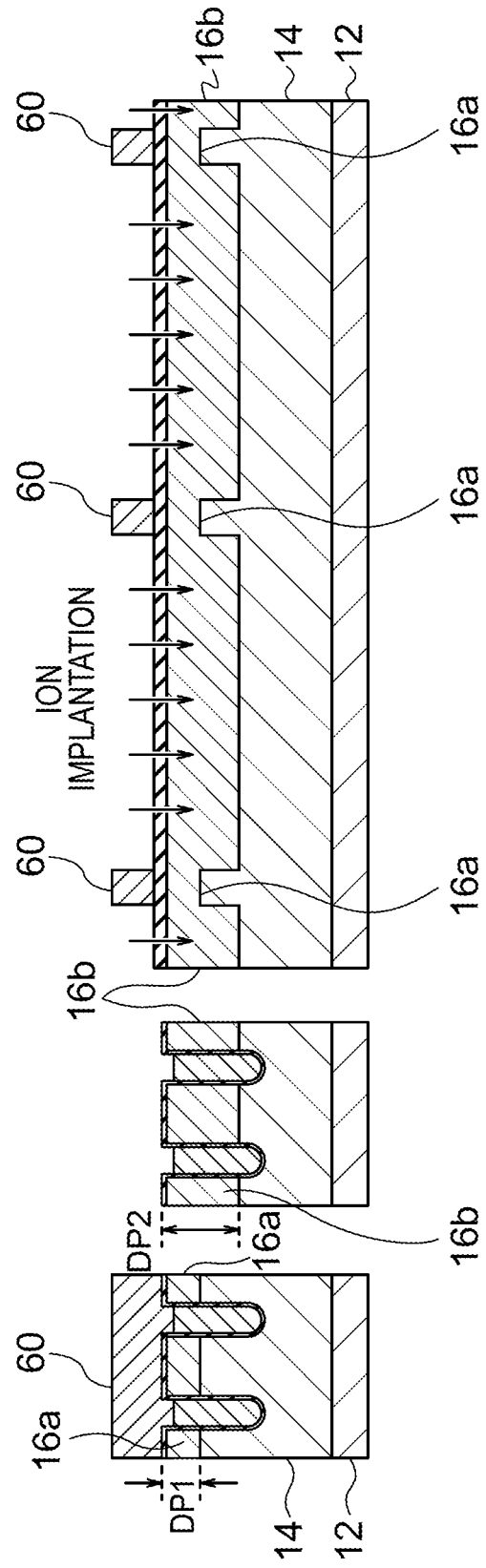
FIGS. 41A, 41B and 41C are illustrations explaining part of the fabrication process of the semiconductor device according to the fourth embodiment.

Subsequently, an example of the fabrication process of the semiconductor device 1 according to the present embodiment will be explained with FIGS. 40A to 40C and FIGS. 41A to 41C. FIGS. 40A and 41A are sectional views of the semiconductor device 1 in the orthogonal-to-trench direction in the first base region 16a, corresponding to the above-described FIG. 35. FIGS. 40B and 41B are sectional views of the semiconductor device 1 in the orthogonal-to-trench direction in the second base region 16b, corresponding to the above-described FIG. 36. FIGS. 40C and 41C are sectional views of the semiconductor device 1 in the longitudinal direction parallel to trenches, corresponding to the above-described FIG. 37.

The fabrication process of the semiconductor device 1 according to the present embodiment is the same as the above-described first embodiment, up to the above-described FIGS. 13A and 13B. After the fabrication step of FIGS. 13A and 13B, as shown in FIGS. 40A to 40C, a base region 16x is formed in the drift region 14, for example, by ion implantation of boron (B) to the entire drift region 14 of the semiconductor device. The boron ion implantation is performed to the depth DP1.

Subsequently, as shown in FIGS. 41A to 41C, photoresist 60 is formed on the region corresponding to the first base region 16a, followed by ion implantation of, for example, boron (B) to the drift region 14 to form the first base regions 16a and the second base regions 16b in the drift region 14. The boron ion implantation is performed to the depth DP2. This ion implantation is performed, for example, at an accelerating voltage higher than an accelerating voltage at which the ion implantation is performed to form the base region 16x. As a result, the first base region 16a is formed from the base region 16x and then, by the ion implantation for the base region 16x and the current ion implantation, the second base region 16b is formed.

The fabrication steps after the steps of FIGS. 41A to 41C are the same as those shown in FIGS. 16A and 16b to 20A and 20b of the above-described first embodiment. After the steps of FIGS. 20A and 20b, the source electrode 26 and the drain electrode 10 are formed to obtain the semiconductor device 1 shown in FIGS. 35 to 39.

As described above, according to the semiconductor device 1 of the present embodiment, it is achieved to form the first base region 16a of the depth DP1 and the second base region 16b of the depth DP2 in one cell C, to configure a MOSFET channel in the first base region 16a, which turns into the on-state at the threshold voltage Vth1 that is lower than the threshold voltage Vth2 of the MOSFET channel formed in the second base region 16b. Therefore, the drain current $I_D$ can be kept low when the gate voltage $V_G$ is at a level between the threshold voltages Vth1 and Vth2, and hence an area of a positive temperature coefficient can be smaller. Therefore, it is achieved to restrict the occurrence of thermal runaway in the semiconductor device 1 to widen the safe operating area.

When the gate voltage $V_G$ becomes higher than the threshold voltage Vth2, the MOSFET channels in both of the first and second base regions 16a and 16b turn into the on-state, thereby a channel being formed in the entire base region 16 to reduce the on-resistance. Moreover, the first base regions 16a of the further lower threshold voltage Vth1 are dispersedly arranged in the semiconductor device 1, so that the generation of heat can be dispersed entirely inside the semiconductor device 1, thereby widening the safe operating area.

Moreover, in the fabrication process of the semiconductor device 1, it is not required to perform ion implantation of different dose amounts, thereby achieving a simplified fabrication process. In detail, as shown in FIGS. 40A to 40C and FIGS. 41A to 41C, the first base region 16a and the second base region 16b are formed to have the depth DP1 and the depth DP2, respectively, of different depths, to form the MOSFET channels of the threshold voltages Vth1 and Vth2, respectively, and hence it is not required to perform ion implantation of different dose amounts.

Fifth Embodiment

In the above-described first to fourth embodiments, the region of the MOSFET channel of the lower threshold voltage Vth1 and the region of the MOSFET channel of the high threshold voltage Vth2 are both formed in one cell. By contrast, in the fifth embodiment, it is performed to separately form a cell C where the MOSFET channel of the lower threshold voltage Vth1 is formed and a cell C where the MOSFET channel of the high threshold voltage Vth2 is formed. Hereinbelow, the portion of the fifth embodiment different from the above-described first embodiment will be explained.

Figure 42:
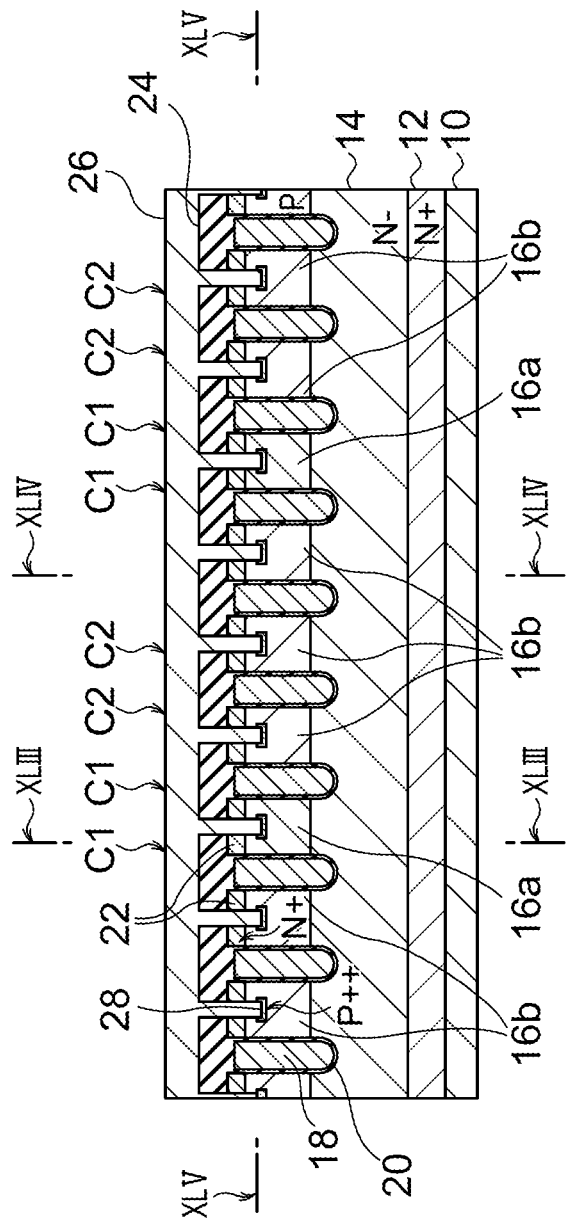
FIG. 42 is a sectional view taken on line XLII-XLII in each of FIGS. 43 and 44 of a semiconductor device according to a fifth embodiment.
Figure 43:
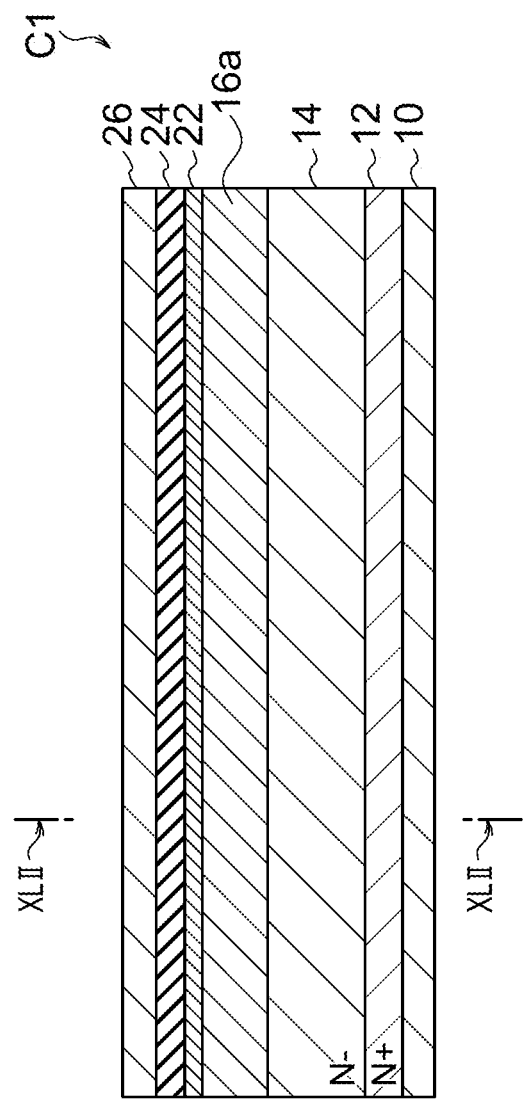
FIG. 43 is a sectional view taken on line XLIII-XLIII in FIG. 42 of the semiconductor device according to the fifth embodiment.
Figure 44:
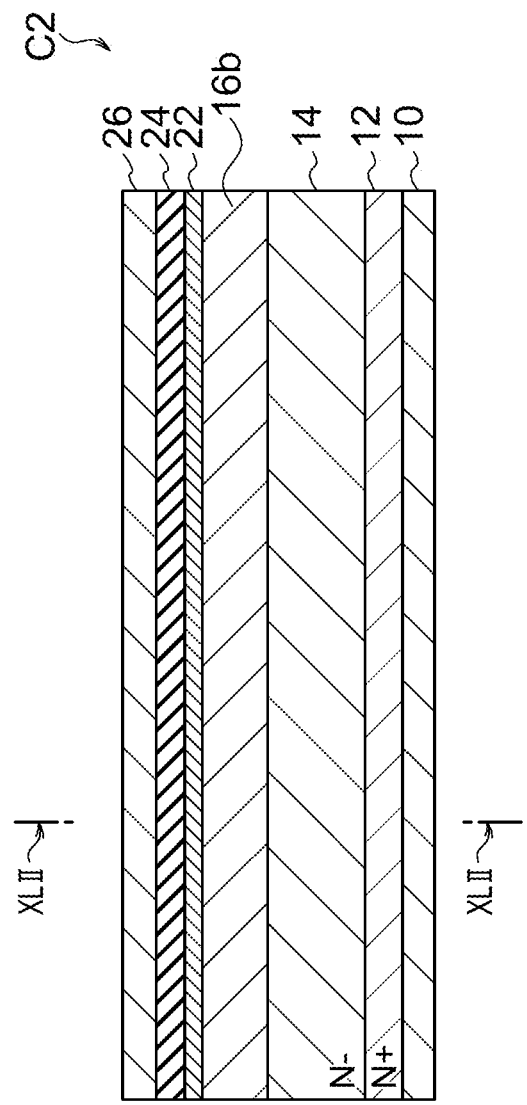
FIG. 44 is a sectional view taken on line XLIV-XLIV in FIG. of the semiconductor device according to the fifth embodiment.
Figure 45:
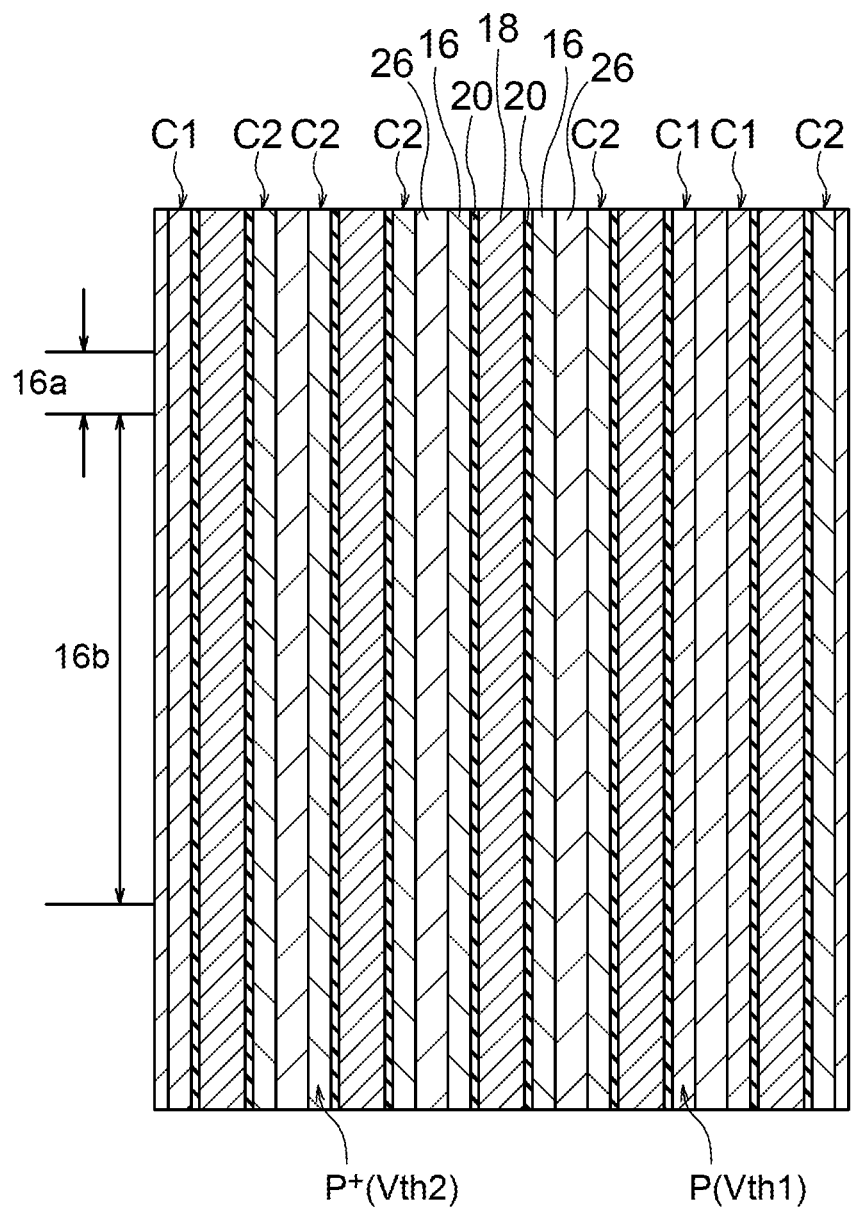
FIG. 45 is a sectional view taken on line XLV-XLV in FIG. of the semiconductor device according to the fifth embodiment.

FIG. 42 is a sectional view taken on line XLII-XLII in each of FIGS. 43 and 44 of a semiconductor device 1 according to the present embodiment. FIG. 43 is a sectional view taken on line XLIII-XLIII in FIG. 42 of the semiconductor device 1 according to the present embodiment. FIG. 44 is a sectional view taken on line XLIV-XLIV in FIG. 42 of the semiconductor device 1 according to the present embodiment. FIG. 45 is a sectional view taken on line XLV-XLV in FIG. 42 of the semiconductor device 1 according to the present embodiment. In other words, FIG. 42 is a sectional view of the semiconductor device 1 in the orthogonal-to-trench direction. FIGS. 43 and 44 are sectional views of the semiconductor device 1 in the trench longitudinal direction parallel to trenches. FIG. 45 is a sectional view of the semiconductor device 1 in the front surface direction.

As understood from these FIGS. 42 to 45, the semiconductor device 1 according to the present embodiment is provided with cells C1 each formed with the first base region 16a of low impurity concentration and cells C2 each formed with the second base region 16b of high impurity concentration. Therefore, the MOSFET channel in each cell C1 has the threshold voltage Vth1 and the MOSFET channel in each cell C2 has the threshold voltage Vth2 higher than Vth1.

Subsequently, an example of the fabrication process of the semiconductor device 1 according to the present embodiment will be explained with FIG. 46 which is a sectional view of the semiconductor device 1 in the orthogonal-to-trench direction, corresponding to the above-described FIG. 42.

The fabrication process of the semiconductor device 1 according to the present embodiment is the same as the above-described first embodiment, up to the above-described FIG. 14. After the fabrication step of FIG. 14, as shown in FIG. 46, photoresist 64 is formed on the portion where the first base regions 16a are to be formed. In more precisely, the photoresist 64 is formed to cover a portion where each first base region 16a is to be formed and part of gate electrodes 18 in the vicinity of the portion on both sides. Succeedingly, again, for example, by ion implantation of boron (B), the first base and second base regions 16a and 16b are formed from the base regions 54. The additional ion implantation is performed with the concentration required for the base regions 54 to have the threshold voltage Vth2. In other words, the second base region 16b having the threshold voltage Vth2 of each cell C2 is formed with the total concentration in the ion implantation performed in FIGS. 14A and 14B, and in FIG. 46. The first base region 16a having the threshold voltage Vth1 of each cell C1 is formed in the region with no additional ion implantation, among the base regions 54.

Figure 46:
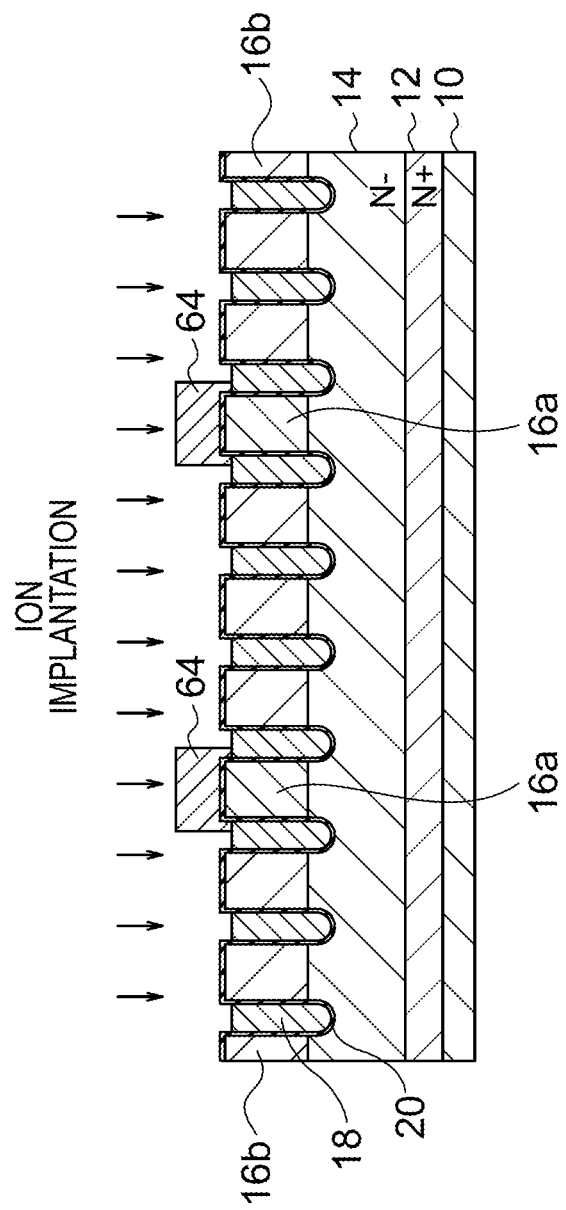
FIG. 46 is an illustration explaining part of a fabrication process of the semiconductor device according to the fifth embodiment.

The fabrication steps after the step of FIG. 46 are the same as those shown in FIGS. 16A and 16b to 20A and 20b of the above-described first embodiment. After the steps of FIGS. 20A and 20b, the source electrode 26 and the drain electrode 10 are formed to obtain the semiconductor device 1 shown in FIGS. 42 to 45.

As described above, in the semiconductor device 1 according to the present embodiment, the cells C1 of MOSFET channels having the threshold voltage Vth1 and the cells C2 of MOSFET channels having the threshold voltage Vth2 are formed, so that the MOSFET channels that turn into the on-state at the threshold voltage Vth1 lower than the threshold voltage Vth2 can be formed in the semiconductor device 1. Therefore, the drain current $I_D$ can be kept low when the gate voltage $V_G$ is at a level between the threshold voltages Vth1 and Vth2, and hence an area of a positive temperature coefficient can be smaller. Therefore, it is achieved to restrict the occurrence of thermal runaway in the semiconductor device 1 to widen the safe operating area.

When the gate voltage $V_G$ becomes higher than the threshold voltage Vth2, the MOSFET channels in both of the cells C1 and C2 turn into the on-state, thereby a channel being formed in the entire base region 16 to reduce the on-resistance. Moreover, the cells C1 of the further lower threshold voltage Vth1 are dispersedly arranged in the semiconductor device 1, so that the generation of heat can be dispersed entirely inside the semiconductor device 1, thereby widening the safe operating area.

Sixth Embodiment

A sixth embodiment, which is a modified version of the above-described first embodiment, has a trench field-plate structure with an embedded source electrode under each gate electrode 18. Hereinbelow, the portion of the sixth embodiment different from the above-described first embodiment will be explained.

Figure 47:
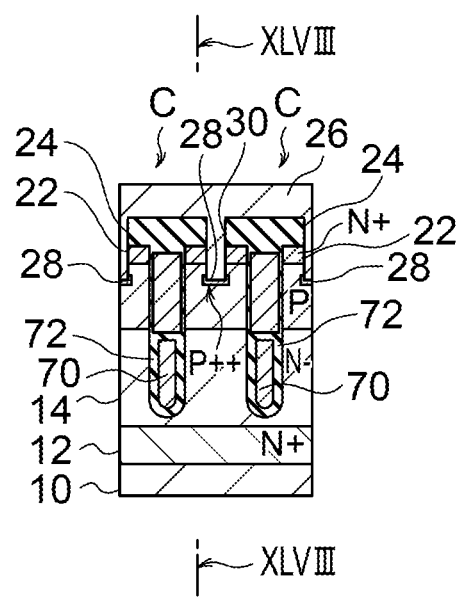
FIG. 47 is a sectional view taken on line XLVII-XLVII in FIG. 48 of a semiconductor device according to a sixth embodiment.
Figure 48:
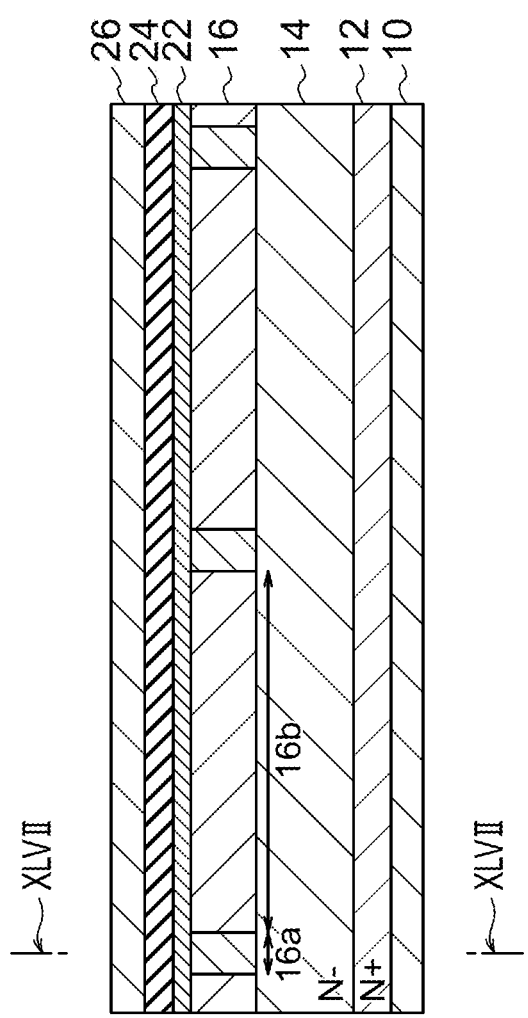
FIG. 48 is a sectional view taken on line XLVIII-XLVIII in FIG. 47 of the semiconductor device according to the sixth embodiment.

FIG. 47 is a sectional view taken on line XLVII-XLVII in FIG. 48 of a semiconductor device 1 according to the present embodiment. FIG. 48 is a sectional view taken on line XLVIII-XLVIII in FIG. 47 of the semiconductor device 1 according to the present embodiment. In other words, FIG. 47 is a sectional view of the semiconductor device 1 in the orthogonal-to-trench direction and FIG. 48 is a sectional view of the semiconductor device 1 in the trench longitudinal direction parallel to trenches.

As understood from FIGS. 47 and 48, the semiconductor device 1 according to the present embodiment has an embedded source electrode 70 provided under each gate electrode 18. In detail, the embedded source electrode 70 is embedded in the drift region 14 via an insulating film 72. Although the insulating film 72 is formed to surround the embedded source electrode 70, the embedded source electrode 70 is electrically connected to the gate electrode 18 or the source electrode 26.

Due to the presence of the embedded source electrode 70, depletion of the drift region 14 is promoted to raise the breakdown voltage of the semiconductor device 1. For the degree of the raised breakdown voltage of the semiconductor device 1, the impurity concentration of the drift region 14 can be raised to reduce the resistance of the drift region 14, thereby reducing the on-resistance of the semiconductor device 1. The above-described trench field-plate structure can be applied, not only to the first embodiment, but also to any of the above-described second to fifth embodiments.

Seventh Embodiment

A semiconductor device 1 according to a seventh embodiment, which is a modified version of the above-described first embodiment, secures electrical connection between the source electrode 26 and the contact region 28 by pillar implantation, instead of the trench contact of the source electrode 26. Hereinbelow, the portion of the seventh embodiment different from the above-described first embodiment will be explained.

Figure 49:
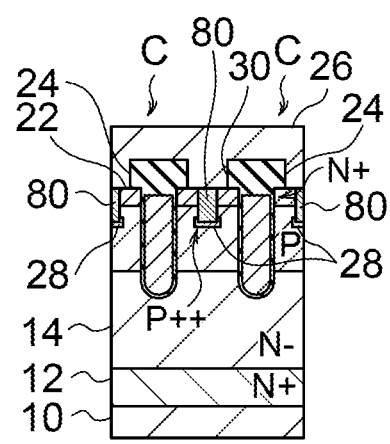
FIG. 49 is a sectional view of a semiconductor device according to a seventh embodiment in an orthogonal-to-trench direction.

FIG. 49 is a sectional view of the semiconductor device 1 according to the present embodiment in the orthogonal-to-trench direction, corresponding to FIG. 1 of the above-described first embodiment. As shown in FIG. 49, in the semiconductor device 1 according to the present embodiment, no trenches 30 are formed, and instead, a p-type pillar 80 is formed between the source electrode 26 and the contact region 28. By means of the pillar 80, the source electrode 26 and the contact region 28 are electrically connected to each other.

In the present embodiment, the pillar 80 is formed with ion implantation. Ion implantation of, for example, boron (B), is performed with thermal diffusion to form the p-type pillar 80. A plurality of times of ion implantation at different depths may be performed to form the p-type pillar 80. As described above, the semiconductor device 1 like that in the first embodiment can be realized, not by the formation of the trench contact with the trenches 30, but by the formation of the pillar 80. The above-described pillar-implantation structure can be applied, not only to the first embodiment, but also to any of the above-described second to sixth embodiments.

The pillar 80 in the present embodiment forms a body contact that electrically connects the source electrode 26 to the source region 22 and the base region 16. Therefore, the pillar 80 according to the present embodiment corresponds to a second semiconductor region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising a cell including a single transistor, the single transistor comprising:
   a first semiconductor region of a first conductive type;
   a base region of a second conductive type on the first semiconductor region;
   a source region of the first conductive type on the base region;
   a gate electrode penetrating through the base region in a first direction to reach the first semiconductor region and extending in a second direction; and
   a gate insulting film between the gate electrode and the first semiconductor region, between the gate electrode and the base region, and between the gate electrode and the source region, wherein
   the single transistor has a region having a first threshold voltage and a region having a second threshold voltage higher than the first threshold voltage,
   when a gate voltage of the single transistor is lower than the first threshold voltage, channels of the single transistor in both of the region having the first threshold voltage and the region having the second threshold voltage are in an off-state, and
   when the gate voltage becomes higher than the first threshold voltage, a channel in the region having the first threshold voltage turns into an on-state whereas a channel in the region having the second threshold voltage remains in the off-state.

2. The semiconductor device according to claim 1, wherein the base region comprises a first base region, having the first threshold voltage, of first impurity concentration, and a second base region, having the second threshold voltage, of second impurity concentration higher than the first impurity concentration.

3. The semiconductor device according to claim 2, wherein the first base region is cyclically formed.

4. The semiconductor device according to claim 1 further comprising a body contact to electrically connect a source electrode to the source region and the base region.

5. The semiconductor device according to claim 4, wherein a contact region of the second conductive type is formed at a bottom of the body contact in the base region, an impurity concentration of the contact region being higher than that of the base region.

6. The semiconductor device according to claim 5, wherein, in a third direction, the base region comprises a first base region of the first threshold voltage, the contact region in the first base region having a first width, and comprises a second base region of the second threshold voltage, the contact region in the second base region having a second width larger than the first width.

7. The semiconductor device according to claim 5, wherein, in a third direction, the base region comprises a first base region of the first threshold voltage, the contact region in the first base region being apart from the gate electrode by a first distance, and comprises a second base region of the second threshold voltage, the contact region in the second base region being apart from the gate electrode by a second distance, the first distance being larger than second distance.

8. The semiconductor device according to claim 4, wherein the body contact is formed integrally with the source electrode.

9. The semiconductor device according to claim 4, wherein the body contact is formed with a second semiconductor region of the second conductive type.

10. The semiconductor device according to claim 1, wherein, the base region comprises:
    a first base region of the first threshold voltage, the base region in the first base region being formed with a first depth in the first direction, and
    a second base region of the second threshold voltage, the base region in the second base region being formed with a second depth deeper than the first depth in the first direction.

11. The semiconductor device according to claim 1 further comprising an embedded source electrode formed under the gate electrode, the embedded source electrode being electrically connected to a source electrode.

12. The semiconductor device according to claim 1 further comprising an embedded gate electrode formed under the gate electrode, the embedded gate electrode being electrically connected to the gate electrode.

13. The semiconductor device according to claim 1, wherein an area of the region having the first threshold voltage is smaller than an area of the region having the second threshold voltage.

14. The semiconductor device according to claim 1, wherein an area of the region having the first threshold voltage is equal to or smaller than one-half of an area of the region having the second threshold voltage.

15. A semiconductor device comprising a plurality of cells, each of the plurality of cells comprising a single transistor, the single transistor comprising:
    a first semiconductor region of a first conductive type;
    a base region of a second conductive type on the first semiconductor region;
    a source region of the first conductive type on the base region;
    a gate electrode penetrating through the base region in a first direction to reach the first semiconductor region and extending in a second direction; and
    a gate insulting film between the gate electrode and the first semiconductor region, between the gate electrode and the base region, and between the gate electrode and the source region,
    wherein the single transistor has a first threshold voltage and a second threshold voltage higher than the first threshold voltage,
    when a gate voltage of the single transistor is lower than the first threshold voltage, channels of the single transistor in both of the region having the first threshold voltage and the region having the second threshold voltage are in an off-state, and
    when the gate voltage becomes higher than the first threshold voltage, a channel in the region having the first threshold voltage turns into an on-state whereas a channel in the region having the second threshold voltage remains in the off-state.

16. The semiconductor device according to claim 15 further comprising an embedded source electrode formed under the gate electrode, the embedded source electrode being electrically connected to a source electrode.

17. The semiconductor device according to claim 15 further comprising an embedded gate electrode formed under the gate electrode, the embedded gate electrode being electrically connected to the gate electrode.

* * * * *